(12) United States Patent
Jang et al.

(10) Patent No.: US 12,009,466 B2
(45) Date of Patent: Jun. 11, 2024

(54) LIGHT EMITTING DEVICE

(71) Applicant: SEOUL VIOSYS CO., LTD., Ansan-si (KR)

(72) Inventors: Seong Gyu Jang, Ansan-si (KR); Chan Seob Shin, Ansan-si (KR); Seom Geun Lee, Ansan-si (KR); Ho Joon Lee, Ansan-si (KR); Jong Hyeon Chae, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 60 days.

(21) Appl. No.: 17/983,239

(22) Filed: Nov. 8, 2022

(65) Prior Publication Data

US 2023/0071708 A1 Mar. 9, 2023

Related U.S. Application Data

(63) Continuation of application No. 16/668,325, filed on Oct. 30, 2019, now Pat. No. 11,502,230.
(Continued)

(51) Int. Cl.
*H01L 33/62* (2010.01)
*H01L 33/52* (2010.01)

(52) U.S. Cl.
CPC ............. *H01L 33/62* (2013.01); *H01L 33/52* (2013.01)

(58) Field of Classification Search
CPC . H01L 33/62; H01L 33/52; H01L 2933/0016; H01L 2933/0025; H01L 33/44;
(Continued)

(56) References Cited

U.S. PATENT DOCUMENTS

| 7,977,688 | B2 | 7/2011 | Kim |
| 9,905,725 | B2 * | 2/2018 | Lee .................... H01L 33/06 |

(Continued)

FOREIGN PATENT DOCUMENTS

| CN | 102593303 | 7/2012 |
| DE | 102016104280 | 9/2017 |

(Continued)

OTHER PUBLICATIONS

Non-Final Office Action dated Oct. 6, 2021, issued to U.S. Appl. No. 16/668,325.
(Continued)

*Primary Examiner* — Shahed Ahmed
*Assistant Examiner* — Khatib A Rahman
(74) *Attorney, Agent, or Firm* — Oblon, McClelland, Maier & Neustadt, L.L.P.

(57) ABSTRACT

A light emitting device including first, second, and third light emitting parts one over another along a first direction, a first conductive pattern at least partially disposed between the second and third light emitting parts and including a first portion extending in a second direction perpendicular to the first direction and electrically coupled with the second light emitting part, and a second portion extending from one end of the first portion, a second conductive pattern disposed on and electrically coupled to the third light emitting part, and a first passivation covering the first light emitting part and including a first portion extending in the second direction and a second portion extending from one end of the first portion and forming an inclined angle with the second direction, in which the first conductive pattern at least partially overlaps with the second portion of the first passivation.

20 Claims, 20 Drawing Sheets

Related U.S. Application Data

(60) Provisional application No. 62/754,733, filed on Nov. 2, 2018.

(58) Field of Classification Search
CPC . H01L 33/382; H01L 27/153; H01L 33/0093; H01L 27/156; H01L 33/24; H01L 33/38
See application file for complete search history.

(56) References Cited

U.S. PATENT DOCUMENTS

| | | | |
|---|---|---|---|
| 10,170,666 | B2 | 1/2019 | Cha et al. |
| 10,622,513 | B2* | 4/2020 | Lee .................. H01L 33/10 |
| 10,686,099 | B2 | 6/2020 | Huppmann et al. |
| 10,748,881 | B2 | 8/2020 | Kim et al. |
| 10,784,240 | B2 | 9/2020 | Jang et al. |
| 10,892,296 | B2 | 1/2021 | Chae et al. |
| 2015/0001561 | A1 | 1/2015 | Katsuno et al. |
| 2016/0099384 | A1* | 4/2016 | Kim .................. H01L 27/156 257/13 |
| 2017/0194298 | A1 | 7/2017 | Negley et al. |
| 2017/0288093 | A1* | 10/2017 | Cha .................. H01L 33/58 |
| 2017/0331021 | A1 | 11/2017 | Chae et al. |
| 2017/0338275 | A1* | 11/2017 | Banna .............. H01L 27/156 |
| 2018/0151548 | A1 | 5/2018 | Pfeuffer et al. |
| 2018/0240952 | A1 | 8/2018 | Moon et al. |
| 2019/0097088 | A1 | 3/2019 | Huppmann et al. |
| 2020/0058825 | A1 | 2/2020 | Jang et al. |
| 2021/0118943 | A1* | 4/2021 | Or-Bach .......... H01L 25/167 |

FOREIGN PATENT DOCUMENTS

| | | |
|---|---|---|
| JP | 2004-015072 | 1/2004 |
| JP | 2010041057 | 2/2010 |
| JP | 2014-175427 | 9/2014 |

OTHER PUBLICATIONS

Final Office Action dated Apr. 15, 2022, issued to U.S. Appl. No. 16/668,325.
Notice of Allowance dated Jul. 11, 2022, issued to U.S. Appl. No. 16/668,325.
Extended European Search Report dated Jul. 1, 2022, for European Patent Application No. 19880003.9.
Office Action dated Nov. 7, 2023, issued to Japanese Patent Application No. 2021-522029 (with English Translation).
Office Action dated Jun. 20, 2023, issued to Japanese Patent Application No. 2021-522029 (with English Translation).

* cited by examiner

LIGHT EMITTING DEVICE

CROSS-REFERENCE TO RELATED APPLICATIONS

This application is a Continuation of U.S. patent application Ser. No. 16/668,325, filed on Oct. 30, 2019, which claims the benefit of United States Provisional Patent Application No. 62/754,733, filed on Nov. 2, 2018, each of which is hereby incorporated by reference for all purposes as if fully set forth herein.

BACKGROUND

Field

Exemplary embodiments of the invention relate generally to a light emitting device and, more specifically, to a light emitting device in which a plurality of light emitting layers are stacked.

Discussion of the Background

Light emitting diodes, as inorganic light sources, are being diversely used in various fields, such as display devices, vehicle lamps, and general lighting. Light emitting diodes are rapidly replacing existing light sources due to their longer lifetime, lower power consumption, and faster response speed than existing light sources.

In general, a display device displays various colors by utilizing mixed colors of blue, green, and red. Each pixel of a display device includes blue, green, and red sub-pixels, and the color of a particular pixel is determined through the colors of these sub-pixels, and an image is displayed by a combination of pixels.

Light emitting diodes have been mainly used as backlight sources in display devices. However, recently, a micro LED display has been developed as a next generation display, which directly displays images by using light emitting diodes.

The above information disclosed in this Background section is only for understanding of the background of the inventive concepts, and, therefore, it may contain information that does not constitute prior art.

SUMMARY

Light emitting devices constructed according to exemplary embodiments of the invention are capable of improving light efficiency.

Additional features of the inventive concepts will be set forth in the description which follows, and in part will be apparent from the description, or may be learned by practice of the inventive concepts.

A light emitting device according to an exemplary embodiment includes a first light emitting part, a second light emitting part, and a third light emitting part disposed one over another, each of the first, second, and third light emitting parts including a first-type semiconductor layer, an active layer, and a second-type semiconductor layer, a first conductive pattern at least partially disposed between the second and third light emitting parts, the first conductive pattern including a first portion electrically coupled with at least one of the first-type and second-type semiconductor layers of the first and second light emitting parts, and a second portion extending from the first portion and disposed on one surface of the second light emitting part between the second and third light emitting parts, and a second conductive pattern disposed on the third light emitting part and electrically coupled with the first conductive pattern, in which the second conductive pattern at least partially overlaps with the second portion of the first conductive pattern.

The second light emitting part may include a via hole passing through at least a portion of the second light emitting part and at least partially filled with an insulating material, and the first portion of the first conductive pattern may be formed along the via hole.

The third light emitting part may include a via hole passing through the third light emitting part, the second conductive pattern may include a first portion formed along the via hole of the third light emitting part, and a second portion extending from the first portion of the second conductive pattern onto one surface of the third light emitting part, and the second portion of the first conductive pattern and the first portion of the second conductive pattern may partially overlap with each other.

The first portion of the first conductive pattern and the first portion of the second conductive pattern may have substantially the same width.

The light emitting device may further include a pad electrically coupled with the second portion of the second conductive pattern.

The second light emitting part may include a via hole passing through at least a portion of the second light emitting part, and the first portion of the first conductive pattern may fill the via hole.

The third light emitting part may include a via hole passing through the third light emitting part, the second conductive pattern may include a first portion at least partially filling the via hole of the third light emitting part, and a second portion extending from the first portion of the second conductive pattern onto one surface of the third light emitting part, and the second portion of the first conductive pattern and the first portion of the second conductive pattern may at least partially overlap with each other.

The first portion of the first conductive pattern and the first portion of the second conductive pattern may have substantially the same width.

The light emitting device may further include a pad electrically coupled with the second portion of the second conductive pattern.

The first portion of the first conductive pattern may be electrically coupled with the first-type semiconductor layer of the first light emitting part, and the second portion of the first conductive pattern may be electrically coupled with the first-type semiconductor layer of the second light emitting part on the one surface of the second light emitting part, and the second conductive pattern may include a first portion electrically coupled with the second portion of the first conductive pattern, and a second portion extending from the first portion of the second conductive pattern and electrically coupled with the first-type semiconductor layer of the third light emitting part.

The first portion of the first conductive pattern may be electrically coupled with the second-type semiconductor layer of the first light emitting part, and the second conductive pattern may include a first portion electrically coupled with the second portion of the first conductive pattern, and a second portion extending from the first portion of the second conductive pattern to one surface of the third light emitting part.

The first portion of the first conductive pattern may be electrically coupled with the second-type semiconductor layer of the second light emitting part, and the second conductive pattern may include a first portion electrically coupled with the second portion of the first conductive pattern, and a second portion extending from the first portion of the second conductive pattern to one surface of the third light emitting part.

The light emitting device may further include a third conductive pattern electrically coupled with the second-type semiconductor layer of the third light emitting part.

The third light emitting part may include a via hole passing through at least a portion of the third light emitting part, and the third conductive pattern may include a first portion disposed along the via hole, and a second portion extending from the first portion of the third conductive pattern onto one surface of the third light emitting part.

The light emitting device may further include a pad electrically coupled with the second portion of the third conductive pattern.

The third light emitting part may include a via hole passing through at least a portion of the third light emitting part, and the third conductive pattern may include a first portion at least partially filling the via hole, and a second portion extending from the first portion of the third conductive pattern to one surface of the third light emitting part.

Each of the first, second, and third light emitting parts may have an inclined outer sidewall.

The light emitting device may further include an insulating layer disposed between the first portion of the first conductive pattern and a side surface of the second light emitting part.

The insulating layer may extend to an outer sidewall of the second light emitting part.

The light emitting device may further include a first adhesion part bonding the first and second light emitting parts, and a second adhesion part bonding the second and third light emitting parts, in which the first adhesion part may extend to an outer sidewall of the first light emitting part, and the second adhesion part may extend to an outer sidewall of the second light emitting part.

The light emitting device may further include an insulating layer extending to an outer sidewall of the first portion of the first conductive pattern and an outer sidewall of the second light emitting part, in which the insulating layer may be disposed between the second light emitting part and the second adhesion part.

Each of the first and second light emitting parts may have an inclined outer sidewall, the first adhesion part may have a width that increases from the first light emitting part toward the second light emitting part, and the second adhesion part may have a width that increases from the second light emitting part toward the third light emitting part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
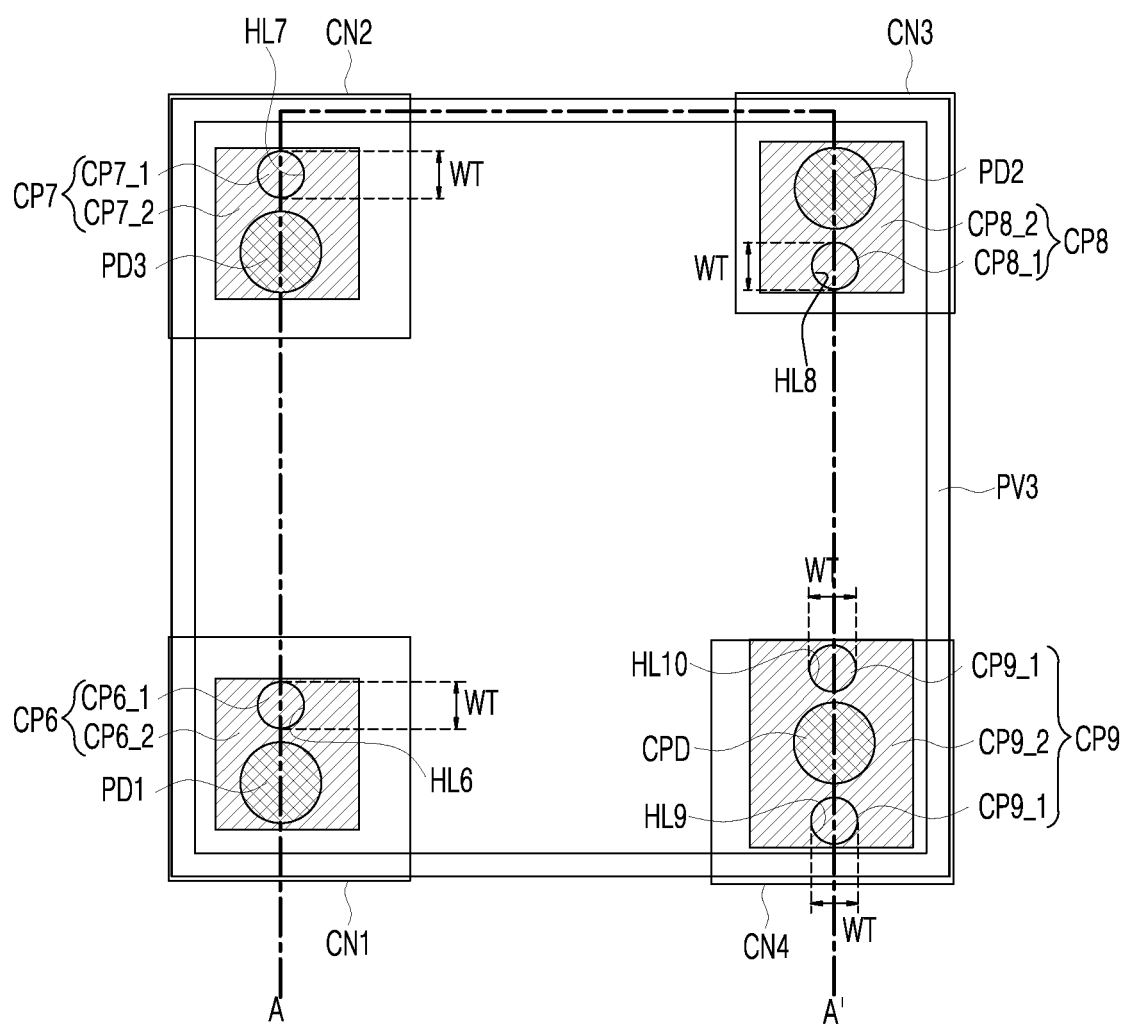
FIG. 1A is a top view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
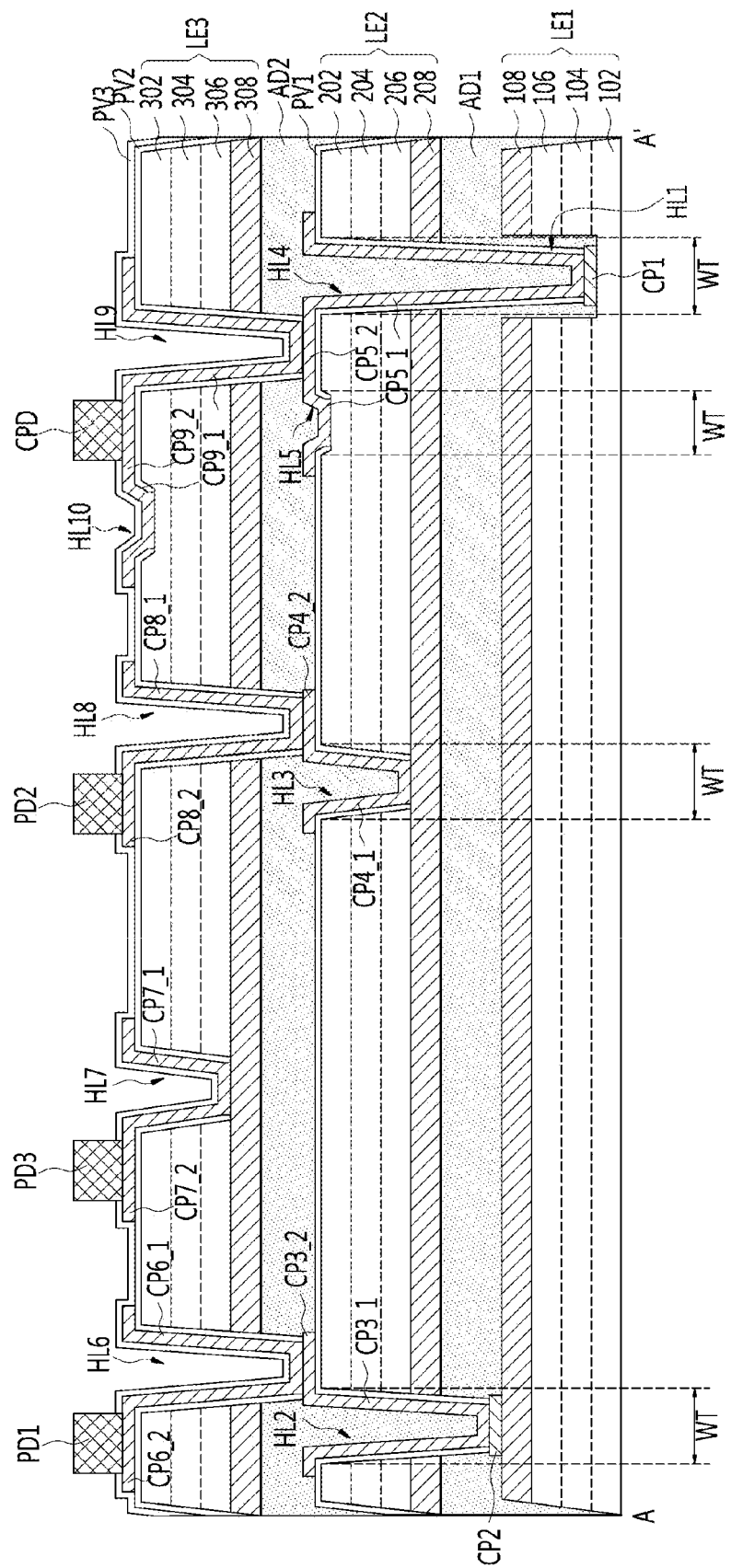
FIGS. 1B and 1C are cross-sectional views taken along line A-A' of FIG. 1A according to exemplary embodiments.
Figure 1C:
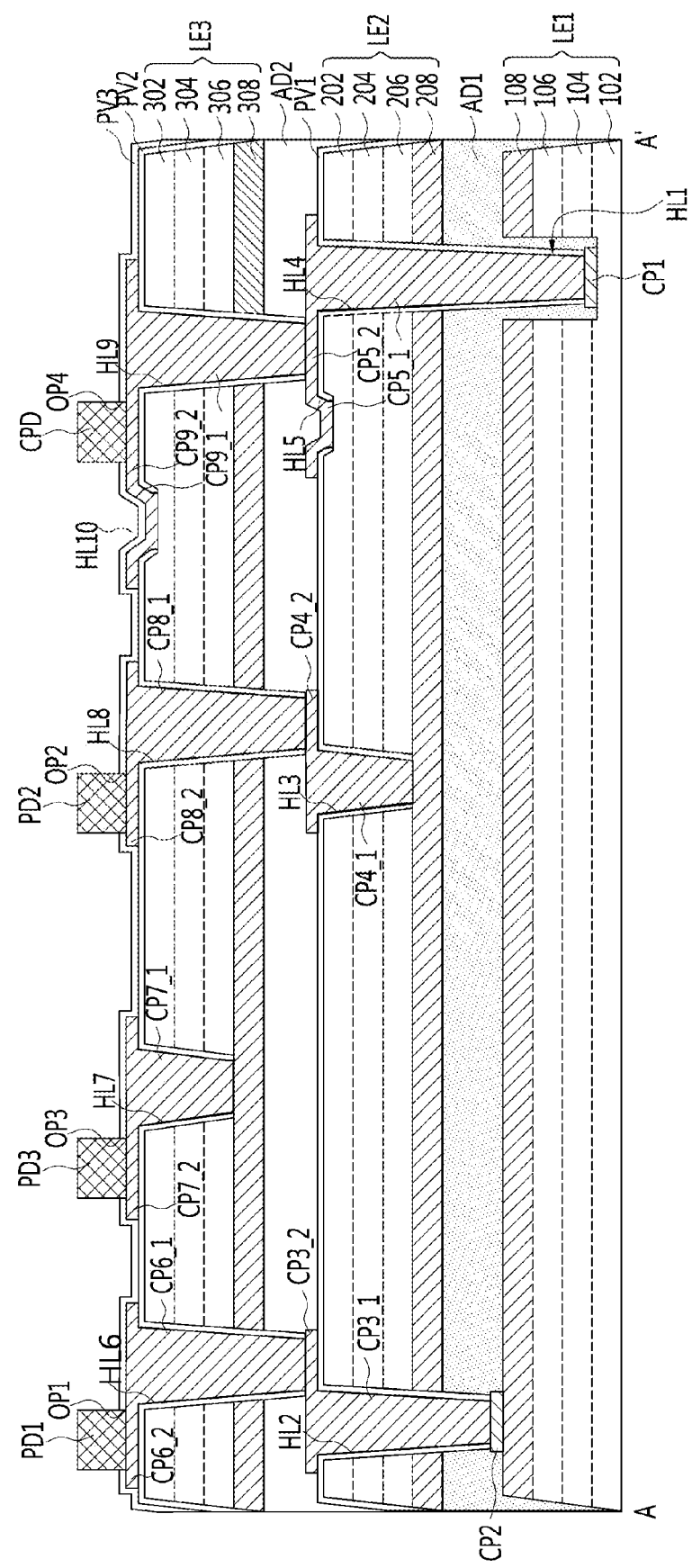

FIG. 1A is a top view of a light emitting device according to an exemplary embodiment, and FIGS. 1B and 1C are cross-sectional views taken along line A-A' of FIG. 1A according to exemplary embodiments.

Referring to FIGS. 1A to 1C, a light emitting device may include a first light emitting part LE1, a second light emitting part LE2, and a third light emitting part LE3.

One surface of the first light emitting part LE1 may face the second light emitting part LE2, and the other, opposing surface of the first light emitting part LE1 may be the light extraction surface of the light emitting device. In this case, the wavelength of light emitted from the first light emitting part LE1 may be the shortest, the wavelength of light emitted from the second light emitting part LE2 may be longer than the wavelength of light emitted from the first light emitting part LE1 and be shorter than the wavelength of light emitted from the third light emitting part LE3, and the wavelength of light emitted from the third light emitting part LE3 may be the longest. For example, the first light emitting part LE1 may emit blue light, the second light emitting part LE2 may emit green light, and the third light emitting part LE3 may emit red light.

In some exemplary embodiments, the first light emitting part LE1 and the second light emitting part LE2 may be stacked in different order from those described the above. For example, the first light emitting part LE1 may be stacked on the second light emitting part LE2, rather than the second light emitting part LE2 being stacked on the first light emitting part LE1. In this case, one surface of the second light emitting part LE2 may face the first light emitting part LE1, and the other, opposing surface of the second light emitting part LE2 may be a light extraction surface of the light emitting device.

The first light emitting part LE1 may include a first n-type semiconductor layer 102, a first active layer 104, a first p-type semiconductor layer 106, and a first ohmic layer 108, which are vertically stacked. The second light emitting part LE2 may include a second ohmic layer 208, a second p-type semiconductor layer 206, a second active layer 204, and a second n-type semiconductor layer 202, which are vertically stacked. The third light emitting part LE3 may include a third ohmic layer 308, a third p-type semiconductor layer 306, a third active layer 304, and a third n-type semiconductor layer 302, which are vertically stacked.

Each of the first n-type semiconductor layer 102, the second n-type semiconductor layer 202, and the third n-type semiconductor layer 302 may be a Si-doped gallium nitride-based semiconductor layer. Each of the first p-type semiconductor layer 106, the second p-type semiconductor layer 206, and the third p-type semiconductor layer 306 may be a Mg-doped gallium nitride-based semiconductor layer. Each of the first active layer 104, the second active layer 204, and the third active layer 304 may include a multi-quantum well (MQW), and the composition ratio thereof may be determined to emit light of a desired peak wavelength. As each of the first ohmic layer 108, the second ohmic layer 208, and the third ohmic layer 308, a transparent conductive oxide (TCO), such as a zinc oxide (ZnO), indium oxide ($InO_2$), tin oxide (SnO), indium tin oxide (ITO), and indium tin zinc oxide (ITZO) may be used, without being limited thereto. For example, in some exemplary embodiments, each of the first ohmic layer 108, the second ohmic layer 208, and the third ohmic layer 308 may include a metal ohmic layer including metal, such as Al, Ti, Cr, Ni, Au, Ag, Sn, W, Cu, or an alloy thereof. The alloy of the metal may be an alloy of Au—Be, Au—Te, or Au—Ge, for example.

According to an exemplary embodiment, the first light emitting part LE1 may have a first hole HL1, which exposes the first n-type semiconductor layer 102. The first hole HL1 may have a vertical side surface or an inclined side surface.

The light emitting device may further include a first conductive pattern CP1, which is brought into electrical contact with the first n-type semiconductor layer 102 exposed by the first hole HL1 of the first light emitting part LE1, and a second conductive pattern CP2, which is brought into electrical contact with the first ohmic layer 108. Each of the first conductive pattern CP1 and the second conductive pattern CP2 may include at least one of Au, Ag, Ni, Al, Rh, Pd, Ir, Ru, Mg, Zn, Pt, Hf, Cr, Ti, and Cu, or an alloy thereof. In some exemplary embodiments, at least one of the first conductive pattern CP1 and the second conductive pattern CP2 may be omitted.

The first light emitting part LE1 may be spaced apart from the second light emitting part LE2. For example, the first ohmic layer 108 of the first light emitting part LE1 and the second ohmic layer 208 of the second light emitting part LE2 may be disposed to face each other. As another example, the first ohmic layer 108 of the first light emitting part LE1 and the second n-type semiconductor layer 202 of the second light emitting part LE2 may be disposed to face each other.

The light emitting device may further include a first adhesion part AD1 disposed between the first light emitting part LE1 and the second light emitting part LE2 to bond the first light emitting part LE1 and the second light emitting part LE2. The first adhesion part AD1 may be transparent, and have an insulating property and an adhesion property. The first adhesion part AD1 may include glass, a polymer, a resist, or a polyimide. For example, the first adhesion part AD1 may include spin-on-glass (SOG), benzo cyclo butadiene (BCB), hydrogen silsesquioxanes (HSQ), polymethylmethacrylate (PMMA), parylene, an SU-8 photoresist, or etc. According to an exemplary embodiment, the first adhesion part AD1 may be disposed while substantially filling the first hole HL1 of the first light emitting part LE1.

According to an exemplary embodiment, the first light emitting part LE1 may have an inclined side surface, such that a width thereof increases in a downward direction. More particularly, the first n-type semiconductor layer 102 of the first light emitting part LE1 may have a greater width than that of the first ohmic layer 108, the first ohmic layer 108 may have a greater width than that of the first p-type semiconductor layer 106, and the first p-type semiconductor layer 106 may have a greater width than that of the first ohmic layer 108. The first adhesion part AD1 may extend to surround the outer sidewall of the first light emitting part LE1.

In some exemplary embodiments, the light emitting device may further include a first color filter disposed between the first light emitting part LE1 and the second light emitting part LE2. For example, the first color filter may be disposed on the first ohmic layer 108 of the first light emitting part LE1. As another example, the first color filter may be disposed on the second ohmic layer 208 of the second light emitting part LE2. The first color filter may reflect light generated from the first light emitting part LE1 while passing light generated from the second light emitting part LE2 and the third light emitting part LE3 therethrough, so that light generated from the first light emitting part LE1 does not exert an influence on each of the second light emitting part LE2 and the third light emitting part LE3. The first color filter may include a distributed Bragg reflector (DBR) having a structure, in which $TiO_2$ and $SiO_2$ are alternately stacked.

The second light emitting part LE2 may include a second hole HL2, which passes through the second light emitting part LE2 and the first adhesion part AD1 and exposes the second conductive pattern CP2, a third hole HL3, which exposes the second ohmic layer 208 of the second light emitting part LE2, and a fourth hole HL4, which passes through the second light emitting part LE2 and the first adhesion part AD1 and exposes the first conductive pattern CP1. The second light emitting part LE2 may further include a fifth hole HL5, which exposes the second n-type semiconductor layer 202 when the second n-type semiconductor layer 202 is etched or the like. In some exemplary embodiments, the fifth hole HL5 may be omitted.

When the first conductive pattern CP1 and the second conductive pattern CP2 are omitted according to another exemplary embodiment, the second hole HL2 may expose a portion of the first ohmic layer 108, and the fourth hole HL4 may expose a portion of the first n-type semiconductor layer 102 in the first hole HLL.

According to an exemplary embodiment, each of the second hole HL2, the third hole HL3, the fourth hole HL4, and the fifth hole HL5 may have an inclined side surface, in which a side surface thereof gradually decreases in the downward direction. A width WT of each of the second hole HL2, the third hole HL3, the fourth hole HL4, and the fifth hole HL5 may have substantially the same size. The width WT of each hole may be the greatest width of the hole. For example, the width WT of each of the second hole HL2, the third hole HL3, the fourth hole HL4, and the fifth hole HL5 may be approximately ⅒ of the size of the light emitting device.

The light emitting device may further include a third conductive pattern CP3, which at least partially fills the second hole HL2, is brought into electrical contact with the second conductive pattern CP2, and extends onto the second light emitting part LE2, a fourth conductive pattern CP4, which at least partially fills the third hole HL3, is brought into electrical contact with the second ohmic layer 208, and extends onto the second light emitting part LE2, and a fifth conductive pattern CP5, which at least partially fills the fourth hole HL4 and the fifth hole HL5, is brought into electrical contact with the first conductive pattern CP1 and the second n-type semiconductor layer 202 of the second light emitting part LE2, and extends onto the second light emitting part LE2. Each of the third conductive pattern CP3, the fourth conductive pattern CP4, and the fifth conductive pattern CP5 may include at least one of Au, Ag, Ni, Al, Rh, Pd, Ir, Ru, Mg, Zn, Pt, Hf, Cr, Ti, and Cu, or an alloy thereof.

When the first conductive pattern CP1 and the second conductive pattern CP2 are omitted according to another exemplary embodiment, the third conductive pattern CP3 may be brought into electrical contact with the first ohmic layer 108 exposed at the bottom of the second hole HL2, and the fourth conductive pattern CP4 may be brought into electrical contact with the first n-type semiconductor layer 102 exposed at the bottom of the fourth hole HL4.

Referring to FIG. 1B, the third conductive pattern CP3 according to the illustrated exemplary embodiment may not completely fill the second hole HL2, and may be thinly and conformally formed along the inner sidewall of the second hole HL2. The third conductive pattern CP3 may include a first portion CP3_1, which is disposed in the second hole HL2 and a second portion CP3_2 which extends from the first portion CP3_1 to the top surface of the second light emitting part LE2. The fourth conductive pattern CP4 may not completely fill the third hole HL3, and may be thinly and conformally formed along the inner sidewall of the third hole HL3. The fourth conductive pattern CP4 may include a first portion CP4_1, which is disposed in the third hole HL3 and a second portion CP4_2, which extends from the first portion CP4_1 to the top surface of the second light emitting part LE2. The fifth conductive pattern CP5 may not completely fill the fourth hole HL4 and the fifth hole HL5, and may be thinly and conformally formed along the inner sidewalls of the fourth hole HL4 and the fifth hole HL5. The fifth conductive pattern CP5 may include first portions CP5_1, which are respectively disposed in the fourth hole HL4 and the fifth hole HL5, and a second portion CP5_2, which couples the first portions CP5_1 and extends from the first portions CP5_1 to the top surface of the second light emitting part LE2. For example, the second portion CP5_2 of the fifth conductive pattern CP5 may be disposed between the fourth hole HL4 and the fifth hole HL5. However, the inventive concepts are not limited thereto.

Referring to FIG. 1C, the third conductive pattern CP3 according to the illustrated exemplary embodiment may include a first portion CP3_1, which fills the second hole HL2, and a second portion CP32, which extends from the first portion CP3_1 and extends on the top surface of the second light emitting part LE2. The fourth conductive pattern CP4 may include a first portion CP4_1, which fills the third hole HL3, and a second portion CP4_2, which extends from the first portion CP4_1 and extends on the top surface of the second light emitting part LE2. The fifth conductive pattern CP5 may include first portions CP5_1, which fill the fourth hole HL4 and the fifth hole HL5, and a second portion CP5_2, which couples the first portions CP5_1 and extends from the first portions CP5_1 to the top surface of the second light emitting part LE2.

The light emitting device may further include a first passivation layer PV1, which surrounds the outer sidewall of the third conductive pattern CP3 between the third conductive pattern CP3 and the second hole HL2, surrounds the outer sidewall of the fourth conductive pattern CP4 between the fourth conductive pattern CP4 and the third hole HL3, surrounds the outer sidewall of the fifth conductive pattern CP5 between the fifth conductive pattern CP5, the fourth hole HL4, and the fifth hole HL5, and extends to the top surface of the second light emitting part LE2 to insulate the third conductive pattern CP3, the fourth conductive pattern CP4, and the fifth conductive pattern CP5 from the second light emitting part LE2. The first passivation layer PV1 may include at least one of $SiN_x$, $TiN_x$, $TiO_x$, $TaO_x$, $ZrO_x$, $HfO_x$, $Al_xO_y$, and $SiO_x$.

According to an exemplary embodiment, the second light emitting part LE2 may have an inclined side surface, such that a width thereof increases in the downward direction. More particularly, the second ohmic layer 208 of the second light emitting part LE2 may be larger than the second p-type semiconductor layer 206, the second p-type semiconductor layer 206 may be larger than the second active layer 204, and the second active layer 204 may be larger than the second n-type semiconductor layer 202. A second adhesion part AD2 may extend to surround the outer sidewall of the second light emitting part LE2. The first passivation layer PV1 may be disposed between the outer sidewall of the second light emitting part LE2 and the second adhesion part AD2. In some exemplary embodiments, the first passivation layer PV1 may be omitted between the outer sidewall of the second light emitting part LE2 and the second adhesion part AD2.

The second light emitting part LE2 may be disposed spaced apart from the third light emitting part LE3. For example, the second n-type semiconductor layer 202 of the second light emitting part LE2 and the third ohmic layer 308 of the third light emitting part LE3 may be disposed to face each other. As another example, the second n-type semiconductor layer 202 of the second light emitting part LE2 and the third n-type semiconductor layer 302 of the third light emitting part LE3 may be disposed to face each other.

The light emitting device may further include the second adhesion part AD2 disposed between the second light emitting part LE2 and the third light emitting part LE3 to bond the second light emitting part LE2 and the third light emitting part LE3. The second adhesion part AD2 may be transparent, and have an insulating property and an adhesion property. The second adhesion part AD2 may include substantially the same material as the first adhesion part AD1, such as glass, a polymer, a resist, or a polyimide. For example, the second adhesion part AD2 may include SOG, BCB, HSQ, or an SU-8 photoresist. According to the illustrated exemplary embodiment of FIG. 1B, the second adhesion part AD2 may substantially fill the second hole HL2 formed with the third conductive pattern CP3, the third hole formed with the fourth conductive pattern CP4, and the fourth hole HL4 and the fifth hole HL5 formed with the fifth conductive pattern CP5.

In some exemplary embodiments, the light emitting device may further include a second color filter disposed between the second light emitting part LE2 and the third light emitting part LE3. For example, the second color filter may be disposed on the third ohmic layer 308. The second color filter may reflect light generated from each of the first light emitting part LE1 and the second light emitting part LE2, while passing light generated from the third light emitting part LE3 therethrough, so that light generated from the first light emitting part LE1 and the second light emitting part LE2 does not exert an influence on the third light emitting part LE3. The second color filter may include a DBR having a structure, in which $TiO_2$ and $SiO_2$ are alternately stacked. For example, the alternation sequence or number of $TiO_2$ and $SiO_2$ in the second color filter may be different from the alternation sequence or number of $TiO_2$ and $SiO_2$ in the first color filter.

The third light emitting part LE3 may include a sixth hole HL6, which passes through the third light emitting part LE3 and the second adhesion part AD2 and exposes the third conductive pattern CP3, a seventh hole HL7, which exposes the third ohmic layer 308 of the third light emitting part LE3, an eighth hole HL8, which passes through the third light emitting part LE3 and the second adhesion part AD2 and exposes the fourth conductive pattern CP4, and a ninth hole HL9, which passes through the third light emitting part LE3 and the second adhesion part AD2 and exposes the fifth conductive pattern CP5. The third light emitting part LE3 may further include a tenth hole HL10, which exposes the third n-type semiconductor layer 302 when the third n-type semiconductor layer 302 is etched or the like. In some exemplary embodiments, the tenth hole HL10 may be omitted.

The sixth hole HL6 may expose the second portion CP3_2 of the third conductive pattern CP3, the eighth hole HL8 may expose the second portion CP4_2 of the fourth conductive pattern CP4, and the ninth hole HL9 may expose the second portion CP5_2 of the fifth conductive pattern CP5. The second portion CP3_2 of the third conductive pattern CP3, the second portion CP4_2 of the fourth conductive pattern CP4, and the second portion CP5_2 of the fifth conductive pattern CP5 may be disposed on the same plane, as each extends on the top surface of the second light emitting part LE2. As such, the sixth hole HL6, the eighth hole HL8, and the ninth hole HL9 may have substantially the same height.

According to an exemplary embodiment, each of the sixth hole HL6, the seventh hole HL7, the eighth hole HL8, the ninth hole HL9, and the tenth hole HL10 may have an inclined side surface, in which a width thereof gradually decreases in the downward direction. A width WT of each of the sixth hole HL6, the seventh hole HL7, the eighth hole HL8, the ninth hole HL9, and the tenth hole HL10 may have substantially the same size. The width WT of each of the sixth hole HL6, the seventh hole HL7, the eighth hole HL8, the ninth hole HL9, and the tenth hole HL10 may be substantially the same as the width of each of the second hole HL2, the third hole HL3, the fourth hole HL4, and the fifth hole HL5. For example, the width WT of each of the sixth hole HL6, the seventh hole HL7, the eighth hole HL8, the ninth hole HL9, and the tenth hole HL10 may be approximately 1/10 of the size of the light emitting device.

The light emitting device may further include a sixth conductive pattern CP6, which at least partially fills the sixth hole HL6, is brought into electrical contact with the second portion CP3_2 of the third conductive pattern CP3, and extends onto the third light emitting part LE3, a seventh conductive pattern CP7, which at least partially fills the seventh hole HL7, is brought into electrical contact with the third ohmic layer 308, and extends onto the third light emitting part LE3, an eighth conductive pattern CP8, which at least partially fills the eighth hole HL8, is brought into electrical contact with the second portion CP4_2 of the fourth conductive pattern CP4, and extends onto the third light emitting part LE3, and a ninth conductive pattern CP9, which at least partially fills the ninth hole HL9 and the tenth hole HL10, is brought into electrical contact with the second portion CP5_2 of the fifth conductive pattern CP5, and extends onto the third light emitting part LE3. Each of the sixth conductive pattern CP6, the seventh conductive pattern CP7, the eighth conductive pattern CP8, and the ninth conductive pattern CP9 may include at least one of Au, Ag, Ni, Al, Rh, Pd, Ir, Ru, Mg, Zn, Pt, Hf, Cr, Ti, and Cu, or an alloy thereof.

According to an exemplary embodiment, the sixth conductive pattern CP6 may be electrically coupled with the third conductive pattern CP3, the third conductive pattern CP3 may be electrically coupled with the second conductive pattern CP2, and the second conductive pattern CP2 may be electrically coupled with the first ohmic layer 108. In this manner, the sixth conductive pattern CP6 may be electrically coupled with the first ohmic layer 108 of the first light emitting part LE1. The seventh conductive pattern CP7 may be electrically coupled with the third ohmic layer 308 of the third light emitting part LE3. The eighth conductive pattern CP8 may be electrically coupled with the fourth conductive pattern CP4, and the fourth conductive pattern CP4 may be electrically coupled with the second ohmic layer 208. In this manner, the eight conductive pattern CP8 may be electrically coupled with the second ohmic layer 208 of the second light emitting part LE2. The ninth conductive pattern CP9 may be electrically coupled with the third n-type semiconductor layer 302 and the fifth conductive pattern CP5, the fifth conductive pattern CP5 may be electrically coupled with the second n-type semiconductor layer 202 and the first conductive pattern CP1, and the first conductive pattern CP1 may be electrically coupled with the first n-type semiconductor layer 102. In this manner, the ninth conductive pattern CP9 may be electrically coupled in common with the first n-type semiconductor layer 102, the second n-type semiconductor layer 202, and the third n-type semiconductor layer 302.

According to the illustrated exemplary embodiment of FIG. 1B, the sixth conductive pattern CP6 may not completely fill the sixth hole HL6, and may be thinly and conformally formed along the inner sidewall of the sixth hole HL6. The sixth conductive pattern CP6 may include a first portion CP6_1, which is disposed in the sixth hole HL6, and a second portion CP6_2, which extends from the first portion CP6_1 to the top surface of the third light emitting part LE3. The seventh conductive pattern CP7 may not completely fill the seventh hole HL7, and may be formed thinly and conformally along the inner sidewall of the seventh hole HL7. The seventh conductive pattern CP7 may include a first portion CP7_1, which is disposed in the seventh hole HL7, and a second portion CP7_2, which extends from the first portion CP7_1 to the top surface of the third light emitting part LE3. The eighth conductive pattern CP8 may not completely fill the eighth hole HL8, and may be formed thinly and conformally along the inner sidewall of the eighth hole HL8. The eighth conductive pattern CP8 may include a first portion CP8_1, which is disposed in the eighth hole HL8 and a second portion CP8_2, which extends from the first portion CP8_1 to the top surface of the third light emitting part LE3. The ninth conductive pattern CP9 may not completely fill the ninth hole HL9 and the tenth hole HL10, and may be formed thinly and conformally along the inner sidewalls of the ninth hole HL9 and the tenth hole HL10. The ninth conductive pattern CP9 may include first portions CP9_1, which are respectively disposed in the ninth hole HL9 and the tenth hole HL10, and a second portion CP9_2, which couples the first portions CP9_1 between the first portions CP9_1 and extends to the top surface of the third light emitting part LE3. The second portion CP9_2 of the ninth conductive pattern CP9 may be disposed between the ninth hole HL9 and the tenth hole HL10. However, the inventive concepts are not limited thereto.

According to another exemplary embodiment shown in FIG. 1C, the sixth conductive pattern CP6 may include a first portion CP6_1, which fills the sixth hole HL6, and a second portion CP6_2, which extends from the first portion CP6_1 to the top surface of the third light emitting part LE3. The seventh conductive pattern CP7 may include a first portion CP7_1, which fills the seventh hole HL7, and a second portion CP7_2, which extends from the first portion CP7_1 to the top surface of the third light emitting part LE3. The eighth conductive pattern CP8 may include a first portion CP8_1, which fills the eighth hole HL8, and a second portion CP8_2, which extends from the first portion CP8_1 to the top surface of the third light emitting part LE3. The ninth conductive pattern CP9 may include first portions CP9_1, which respectively fill the ninth hole HL9 and the tenth hole HL10, and a second portion CP9_2, which couples the first portions CP9_1, extends from the first portions CP9-1 to the top surface of the third light emitting part LE3.

The light emitting device may further include a second passivation layer PV2, which surrounds the outer sidewall of the sixth conductive pattern CP6 between the sixth conductive pattern CP6 and the sixth hole HL6, surrounds the outer sidewall of the seventh conductive pattern CP7 between the seventh conductive pattern CP7 and the seventh hole HL7, surrounds the outer sidewall of the eighth conductive pattern CP8 between the eighth conductive pattern CP8 and the eighth hole HL8, surrounds the outer sidewall of the ninth conductive pattern CP9 between the ninth conductive pattern CP9, the ninth hole HL9, and the tenth hole HL10, and extends to the top surface of the third light emitting part LE3 to insulate the sixth conductive pattern CP6, the seventh conductive pattern CP7, the eighth conductive pattern CP8, and the ninth conductive pattern CP9 from the third light emitting part LE3. The second passivation layer PVT2 may include substantially the same material as the first passivation layer PVT1. For example, the second passivation layer PVT2 may include at least one of $SiN_x$, $TiN_x$, $TiO_x$, $TaO_x$, $ZrO_x$, $HfO_x$, $Al_xO_y$, and $SiO_x$.

According to an exemplary embodiment, the third light emitting part LE3 may have an inclined side surface, such that a width thereof increases in the downward direction. More particularly, the third ohmic layer 308 of the third light emitting part LE3 may be larger than the third p-type semiconductor layer 306, the third p-type semiconductor layer 306 may be larger than the third active layer 304, and the third active layer 304 may be larger than the third n-type semiconductor layer 302. The second passivation layer PV2 may extend to surround the outer sidewall of the third light emitting part LE3.

The light emitting device may further include a first pad PD1, which is brought into electrical contact with the sixth conductive pattern CP6 electrically coupled with the first ohmic layer 108, a second pad PD2, which is brought into electrical contact with the eighth conductive pattern CP8 electrically coupled with the second ohmic layer 208, a third pad PD3, which is brought into electrical contact with the seventh conductive pattern CP7 electrically coupled with the third ohmic layer 308, and a common pad CPD, which is brought into electrical contact with the ninth conductive pattern CP9 electrically coupled with the first n-type semiconductor layer 102, the second n-type semiconductor layer 202, and the third n-type semiconductor layer 302. Each of the first pad PD1, the second pad PD2, the third pad PD3, and the common pad CPD may include at least one of Au, Ag, Ni, Al, Rh, Pd, Ir, Ru, Mg, Zn, Pt, Hf, Cr, Ti, and Cu, or an alloy thereof.

According to an exemplary embodiment, when the light emitting device has a quadrangular structure when viewed from the top, the first pad PD1, the second pad PD2, the third pad PD3, and the common pad CPD may be respectively disposed at corner portions of the light emitting device. For example, the first pad PD1 may be disposed at a first corner CN1, the second pad PD2 may be disposed at a third corner CN3, the third pad PD3 may be disposed at a second corner CN2, and the common pad CPD may be disposed at a fourth corner CN4.

The light emitting device may further include a third passivation layer PV3, which is disposed on the third light emitting part LE3 and exposing the first pad PD1, the second pad PD2, the third pad PD3, and the common pad CPD. The third passivation layer PV3 may include substantially the same material as the first passivation layer PV1 or the second passivation layer PV2. For example, the third passivation layer PV3 may include at least one of $SiN_x$, $TiN_x$, $TiO_x$, $TaO_x$, $ZrO_x$, $HfO_x$, $Al_xO_y$, and $SiO_x$. According to an exemplary embodiment, the second passivation layer PV2 may be disposed between the outer sidewall of the third light emitting part LE3 and the third passivation layer PV3. As another example, the second passivation layer PV2 may be omitted between the outer sidewall of the third light emitting part LE3 and the third passivation layer PV3.

The third passivation layer PV3 shown in FIG. 1B may be conformally formed on the second passivation layer PV2, while not completely filling the sixth hole HL6, the seventh hole HL7, the eighth hole HL8, the ninth hole HL9, and the tenth hole HL10 formed with the sixth conductive pattern CP6, the seventh conductive pattern CP7, the eighth conductive pattern CP8, and the ninth conductive pattern CP9. However, the inventive concepts are not limited thereto. For example, in some exemplary embodiments, the third passivation layer PVT3 may fill the sixth hole HL6, the seventh hole HL7, the eighth hole HL8, the ninth hole HL9, and the tenth hole HL10 formed with the sixth conductive pattern CP6, the seventh conductive pattern CP7, the eighth conductive pattern CP8, and the ninth conductive pattern CP9.

The third passivation layer PV3 shown in FIG. 1C according to another exemplary embodiment may be formed on the top surfaces of the sixth conductive pattern CP6, the seventh conductive pattern CP7, the eighth conductive pattern CP8, and the ninth conductive pattern CP9, and on the second passivation layer PV2.

In the second light emitting part LE2 and the first adhesion part AD1 of the light emitting device described above, the second hole HL2 exposing the second conductive pattern CP2 and electrically coupled with the first ohmic layer 108, the third hole HL3 exposing the second ohmic layer 208, the fourth hole HL4 exposing the first conductive pattern CP1 and electrically coupled with the first n-type semiconductor layer 102, and the fifth hole HL5 exposing the second n-type semiconductor layer 202 may be formed, and the third conductive pattern CP3, the fourth conductive pattern CP4, and the fifth conductive pattern CP5 at least partially filling the second hole HL2, the third hole HL3, the fourth hole HL4, and the fifth hole HL5 may be disposed. Further, in the third light emitting part LE3 and the second adhesion part AD2, the sixth hole HL6 exposing the third conductive pattern CP3, the seventh hole HL7 exposing the third ohmic layer 308, the eighth hole HL8 exposing the fourth conductive pattern CP4, the ninth hole HL9 exposing the fifth conductive pattern CP5, and the tenth hole HL10 exposing the third n-type semiconductor layer 302 may be formed, and the sixth conductive pattern CP6, the seventh conductive pattern CP7, the eighth conductive pattern CP8, and the ninth conductive pattern CP9 at least partially filling the sixth hole HL6, the seventh hole HL7, the eighth hole HL8, the ninth hole HL9, and the tenth hole HL10 may be disposed. In this manner, conductive patterns electrically coupled with the first light emitting part LE1 may be disposed in the second light emitting part LE2 and the first adhesion part AD1, and conductive patterns electrically coupled with the conductive patterns coupled with the first light emitting part LE1 may be separately disposed in the third light emitting part LE3 and the second adhesion part AD2. As such, the first pad PD1 may be electrically stably coupled with the first ohmic layer 108 through the third conductive pattern CP3 and the second conductive pattern CP2 along the sixth conductive pattern CP6. The second pad PD2 may be electrically stably coupled with the second ohmic layer 208 through the fourth conductive pattern CP4 along the eighth conductive pattern CP8. The third pad PD3 may be electrically stably coupled with the third ohmic layer 308 through the seventh conductive pattern CP7. Further, the common pad CPD may be electrically stably coupled with the third n-type semiconductor layer 302 through the ninth conductive pattern CP9, with the second n-type semiconductor layer 202 through the fifth conductive pattern CP5 along the ninth conductive pattern CP9, and with the first n-type semiconductor layer 102 through the first conductive pattern CP1 along the fifth conductive pattern CP5.

Meanwhile, in order to manufacture a light emitting device, various processes are performed on a substrate, which may be made of a material, such as sapphire. In this case, a tensile stress may be induced during the manufacture, which may cause a warpage phenomenon, such as the center portion of the substrate being warped in a downward direction. As such, the first adhesion part AD1 and the second adhesion part AD2 according to exemplary embodiment may mitigate the tensile stress applied to the substrate.

Moreover, as will be described in more detail below, the first light emitting part LE1 is isolated while the first hole HL1 is formed, the second light emitting part LE2 is isolated while the second hole HL2, the third hole HL3, the fourth hole HL4, and the fifth hole HL5 are formed, and the third light emitting part LE3 is isolated while the sixth hole HL6, the seventh hole HL7, the eighth hole HL8, the ninth hole HL9, and the tenth hole HL10 are formed. In this manner, the tensile stress applied to the substrate may be further mitigated.

Hereafter, a method for manufacturing the light emitting device of FIGS. 1A and 1B will be described in more detail.

FIGS. 2 to 16 are cross-sectional views illustrating a method for manufacturing a light emitting device according to an exemplary embodiment.

Figure 2:
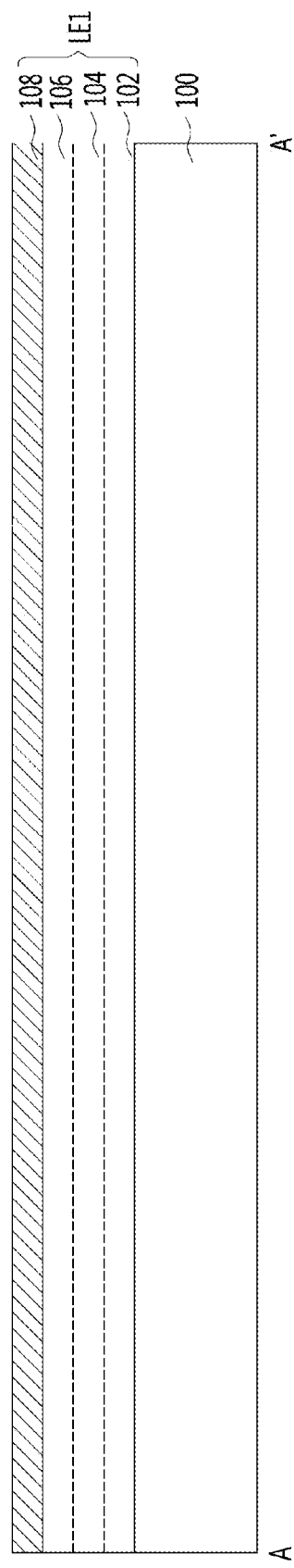
FIGS. 2, 3, 4, 5, 6, 7, 8, 9, 10, 11, 12, 13, 14, 15, and 16 are cross-sectional views illustrating a method for manufacturing a light emitting device according to an exemplary embodiment.

Referring to FIG. 2, a first n-type semiconductor layer 102, a first active layer 104, a first p-type semiconductor layer 106, and a first ohmic layer 108 may be sequentially formed on a first substrate 100, to form a first light emitting part LE1.

The first substrate 100 may be capable of growing a gallium nitride-based semiconductor layer thereon, and may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$), a gallium arsenic (GaAs), or silicon (Si). Also, the first substrate 100 may be a flexible substrate and/or may include a circuit therein.

The first n-type semiconductor layer 102, the first active layer 104, and the first p-type semiconductor layer 106 may be sequentially formed on the first substrate 100 by a growing method, such as metal organic chemical vapor deposition (MOCVD), molecular beam epitaxy (MBE), hydride vapor phase epitaxy (HVPE), and metal-organic chloride (MOC).

The first ohmic layer 108 may be formed on the first p-type semiconductor layer 106 through a chemical vapor deposition (CVD) process or a physical vapor deposition (PVD).

Figure 3:
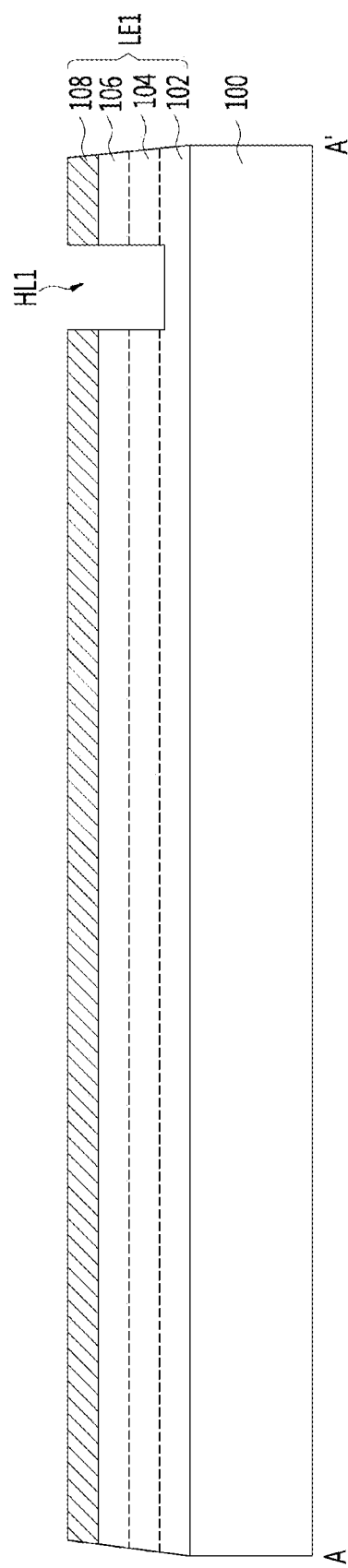

Referring to FIG. 3, by etching the first ohmic layer 108, the first p-type semiconductor layer 106, and the first active layer 104, a first hole HL1 may be formed in the first light emitting part LE1. In this manner, a top portion of the first n-type semiconductor layer 102 may be exposed during the etching process.

After forming the first hole HL1 by etching the first ohmic layer 108, the first p-type semiconductor layer 106, the first active layer 104, and the first n-type semiconductor layer 102, the first light emitting part LE1 may be isolated to suppress a tensile stress from being applied to the first substrate 100.

Figure 4:
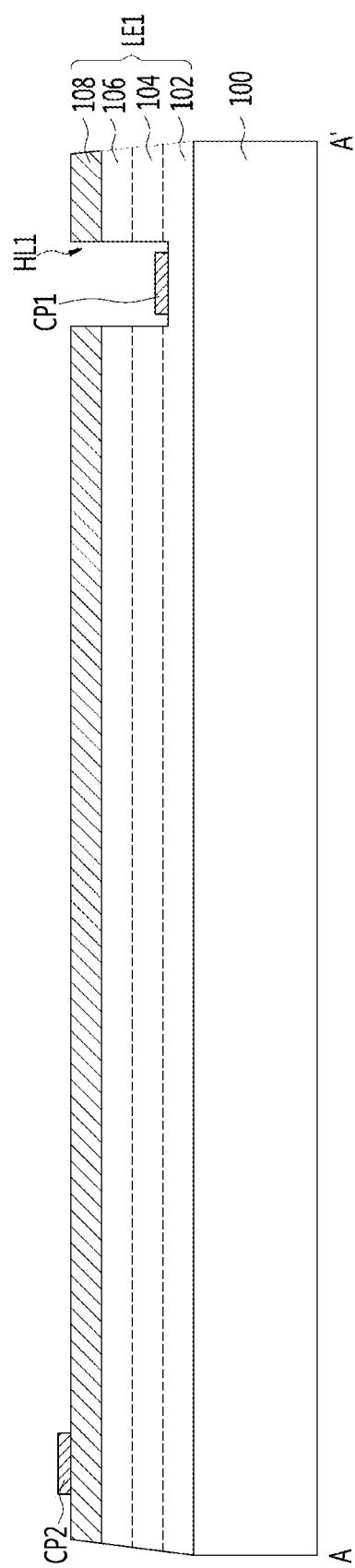

Referring to FIG. 4, a first conductive pattern CP1 and a second conductive pattern CP2 may be respectively formed in the first light emitting part LE1. The first conductive pattern CP1 may be formed in the first hole HL1 while being spaced apart from the inner sidewall of the first hole HL1. The second conductive pattern CP2 may be formed on the first ohmic layer 108.

For example, after forming a conductive layer on the top surface of the first light emitting part LE1 formed with the first hole HL1, the first conductive pattern CP1 and the second conductive pattern CP2 may be respectively formed through a patterning process generally known in the art.

Figure 5:
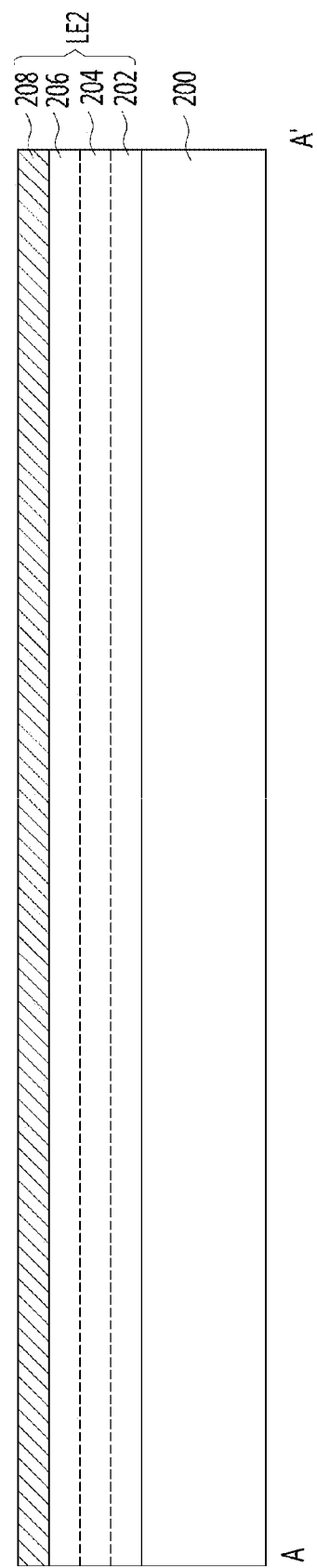

Referring to FIG. 5, a second n-type semiconductor layer 202, a second active layer 204, a second p-type semiconductor layer 206, and a second ohmic layer 208 may be sequentially formed on a second substrate 200 to form a second light emitting part LE2.

The second substrate 200 may be capable of growing a gallium nitride-based semiconductor layer thereon, and may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$), a gallium arsenic (GaAs), or silicon (Si). Also, the second substrate 200 may be a flexible substrate, and/or may include a circuit therein.

The second n-type semiconductor layer 202, the second active layer 204 and the second p-type semiconductor layer 206 may be sequentially formed on the second substrate 200 by using a growing method, such as MOCVD, MBE, HVPE, and MOC.

The second ohmic layer 208 may be formed on the second p-type semiconductor layer 206 through a CVD or PVD process.

Figure 6:
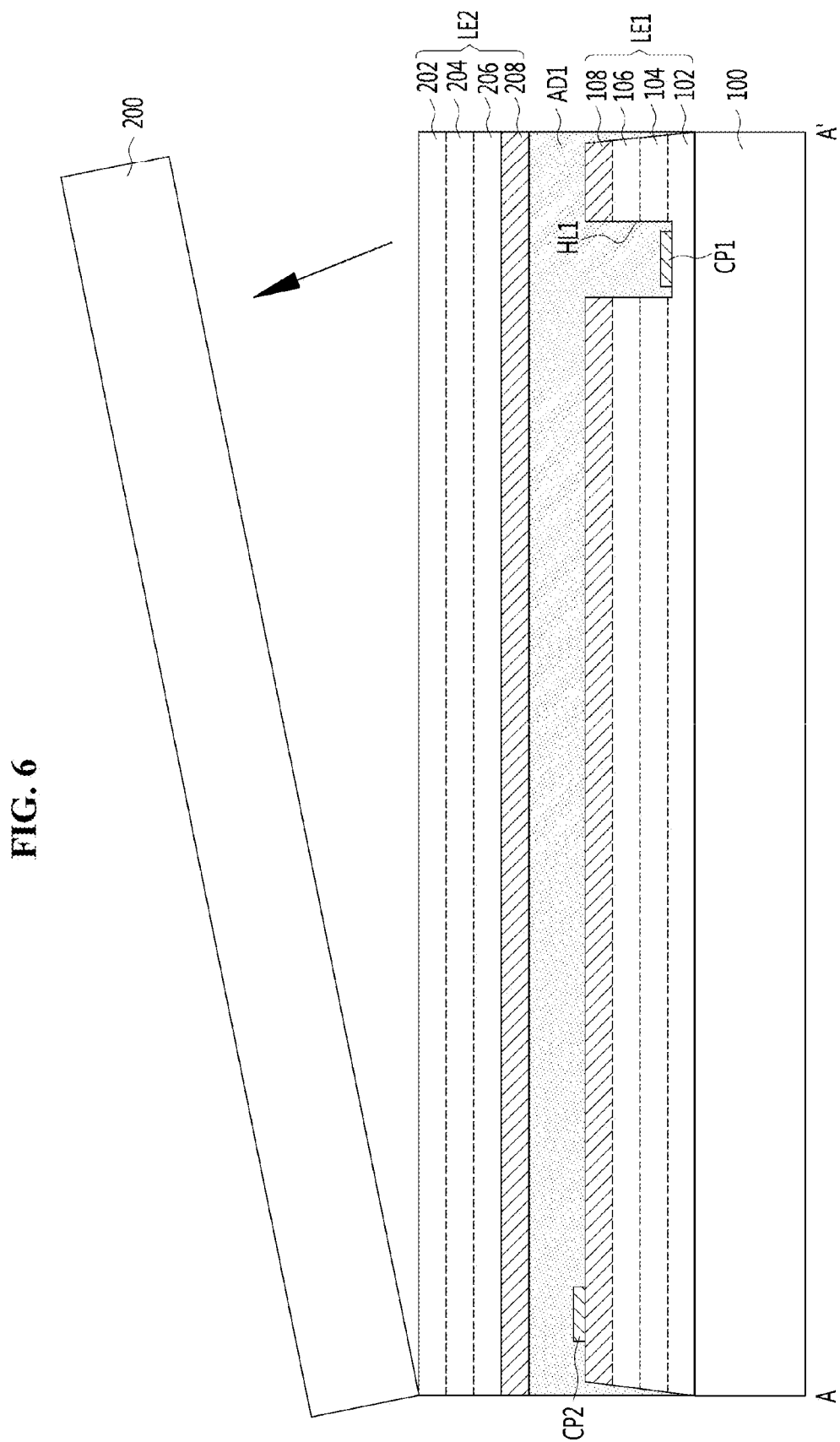

Referring to FIG. 6, by turning over the second substrate 200, the first ohmic layer 108 of the first light emitting part LE1 and the second ohmic layer 208 of the second light emitting part LE2 may be disposed to face each other, and the first light emitting part LE1 and the second light emitting part LE2 may be bonded with each other through a first adhesion part AD1.

For example, after the first adhesion part AD1 is formed on the first light emitting part LE1 to fill the first hole HL1 formed with the first conductive pattern CP1, and the second ohmic layer 208 is disposed to face the first ohmic layer 108, the first adhesion part AD1 may be cured through a thermal process or the like to bond the first light emitting part LE1 and the second light emitting part LE2 with each other.

In this case, the first adhesion part AD1 may surround the first light emitting part LE1 and function as a protective layer that protects the side surface of the first light emitting part LE1.

After the first light emitting part LE1 and the second light emitting part LE2 are bonded with each other by the first adhesion part AD1, the second substrate 200 may be removed through a laser lift-off (LLO) process, for example.

Figure 7:
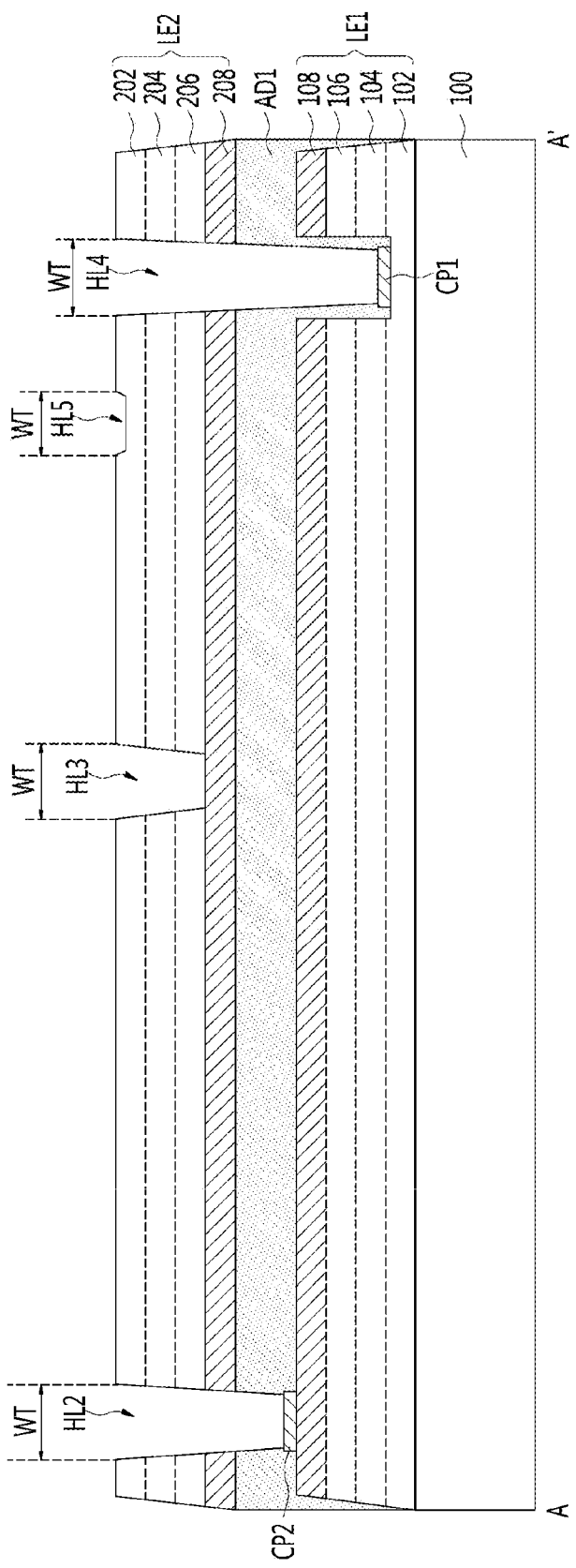

Referring to FIG. 7, by etching the second light emitting part LE2 and the first adhesion part AD1, a second hole HL2 exposing the second conductive pattern CP2, a third hole HL3 exposing the second ohmic layer 208, a fourth hole HL4 exposing the first conductive pattern CP1, and a fifth hole HL5 exposing a portion of the second n-type semiconductor layer 202 may be formed. In some exemplary embodiments, the fifth hole HL5 may not be formed.

Each of the second hole HL2, the third hole HL3, the fourth hole HL4, and the fifth hole HL5 may have substantially the same width WT. Each of the second hole HL2, the third hole HL3, the fourth hole HL4, and the fifth hole HL5 may have an inclined side surface, in which a width thereof gradually decreases in a downward direction.

While forming the second hole HL2, the third hole HL3, the fourth hole HL4, and the fifth hole HL5, by etching the second n-type semiconductor layer 202, the second active layer 204, the second p-type semiconductor layer 206, and the first ohmic layer 108, the second light emitting part LE2 may be isolated to suppress a tensile stress from being applied to the first substrate 100.

In addition, each of the first and second light emitting part LE1 and LE2 has a tapered side surface, in which an area thereof gradually decreases toward an upper direction from the first substrate 100.

Figure 8:
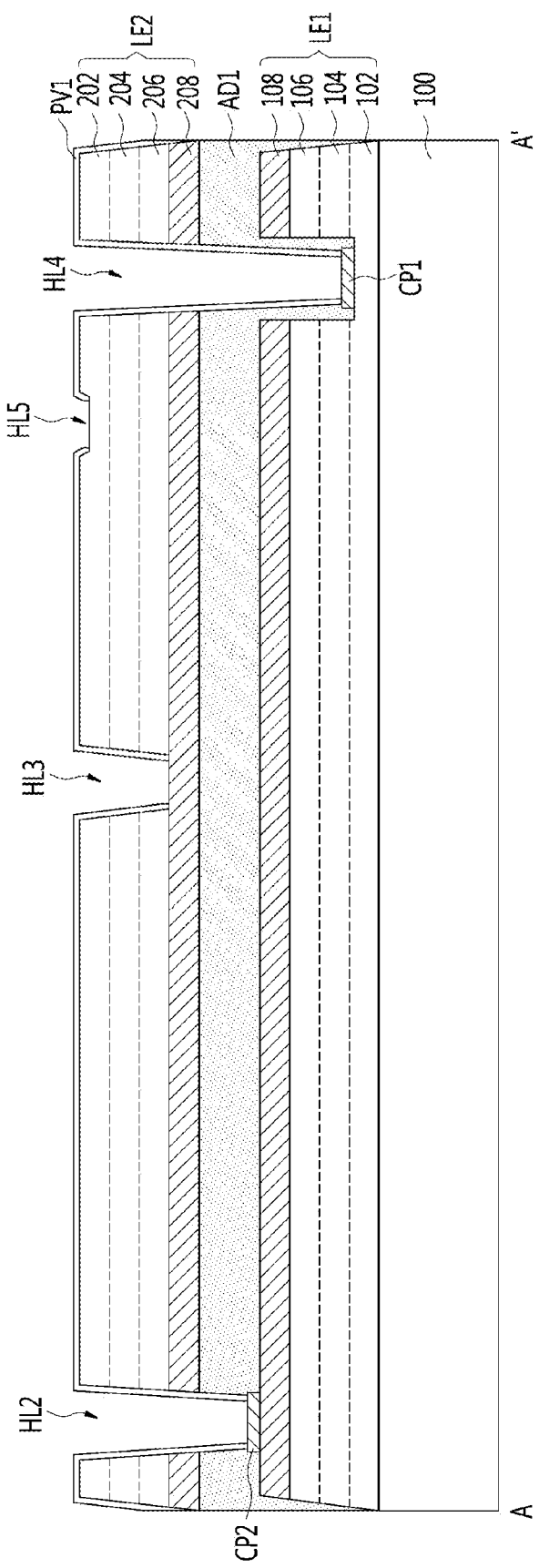

Referring to FIG. 8, a first passivation layer PV1 may be formed on the inner sidewalls of the second hole HL2, the third hole HL3, the fourth hole HL4, and the fifth hole HL5, and on the top surface of the second n-type semiconductor layer 202.

For example, the first passivation layer PV1 may be conformally formed on the second light emitting part LE2 and the first adhesion part AD1 formed with the second hole HL2, the third hole HL3, the fourth hole HL4, and the fifth hole HL5, while not completely filling the second hole HL2, the third hole HL3, the fourth hole HL4, and the fifth hole HL5. In this case, an inclined side surface of each of the second hole HL2, the third hole HL3, the fourth hole HL4, and the fifth hole HL5 may facilitate conformal deposition of the first passivation layer PV1. Then, the first passivation layer PV1 formed on the bottoms of the second hole HL2, the third hole HL3, the fourth hole HL4, and the fifth hole HL5 may be removed.

The first passivation layer PV1 may be retained on the outer sidewall of the second light emitting part LE2. However, the inventive concepts are not limited thereto, and in some exemplary embodiments, the first passivation layer PV1 may be removed from the outer sidewall of the second light emitting part LE2.

Figure 9:
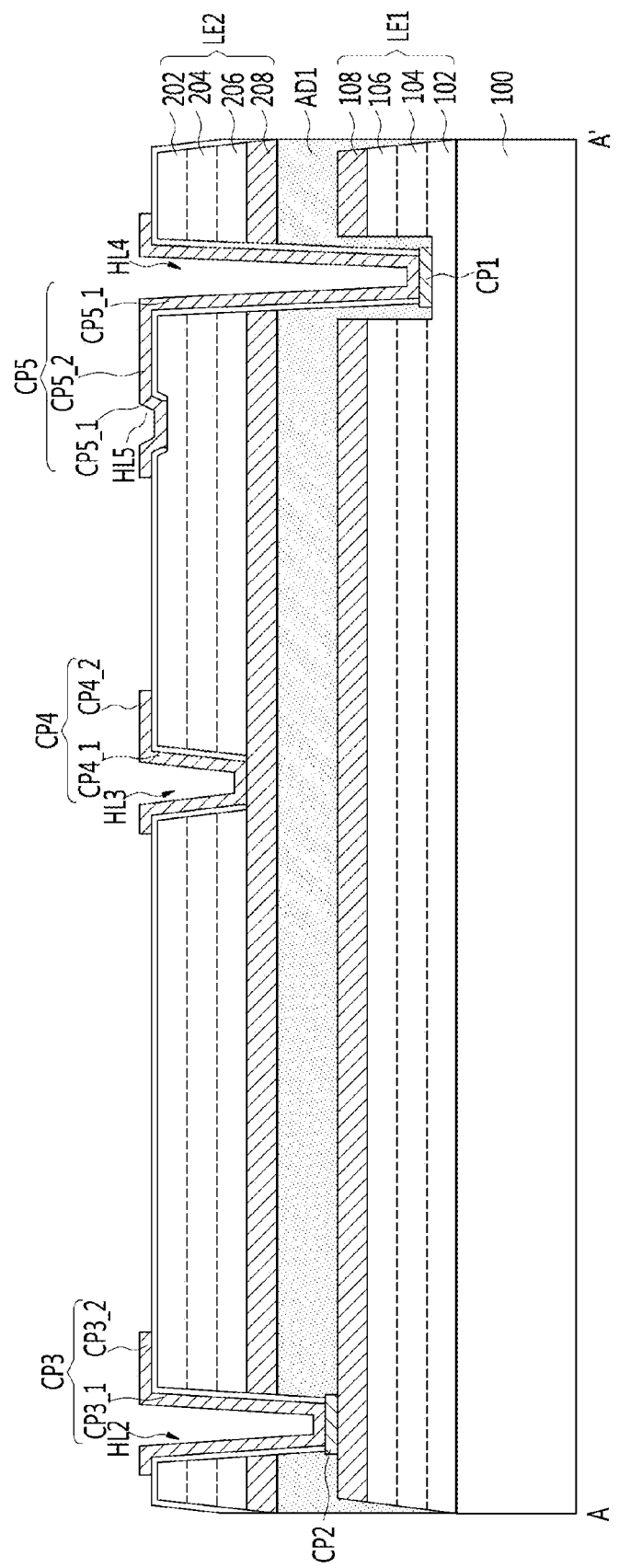

Referring to FIG. 9, a third conductive pattern CP3, a fourth conductive pattern CP4, and a fifth conductive pattern CP5, which at least partially fill the second hole HL2, the third hole HL3, the fourth hole HL4, and the fifth hole HL5 formed with the first passivation layer PV1 may be respectively formed.

For example, by using a deposition process, a first conductive layer may be conformally formed on the first passivation layer PV1 while not completely filling the second hole HL2, the third hole HL3, the fourth hole HL4, and the fifth hole HL5 formed with the first passivation layer PV1. As described above, an inclined side surface of each of the second hole HL2, the third hole HL3, the fourth hole HL4, and the fifth hole HL5 may facilitate conformal deposition of the first conductive layer. Then, the third conductive pattern CP3, which is electrically coupled with the first conductive pattern CP1 and at least partially fills the second hole HL2, the fourth conductive pattern CP4, which is electrically coupled with the second ohmic layer 208 and at least partially fills the third hole HL3, and the fifth conductive pattern CP5, which is electrically coupled with the first conductive pattern CP1, at least partially fills the fourth hole HL4, is electrically coupled with the second n-type semiconductor layer 202, and at least partially fills the fifth hole HL5 may be respectively formed.

The third conductive pattern CP3 may include a first portion CP3_1, which is formed in the second hole HL2, and a second portion CP32, which extends from the first portion CP3_1 onto the first passivation layer PV1 formed on the second n-type semiconductor layer 202. The fourth conductive pattern CP4 may include a first portion CP4_1, which is formed in the third hole HL3, and a second portion CP4_2, which extends from the first portion CP4_1 onto the first passivation layer PV1 formed on the second n-type semiconductor layer 202. The fifth conductive pattern CP5 may include first portions CP5_1, which are respectively formed in the fourth hole HL4 and the fifth hole HL5, and a second portion CP5_2, which couples the first portions CP5_1 and extends onto the first passivation layer PV1 formed on the second n-type semiconductor layer 202.

While the third conductive pattern CP3, the fourth conductive pattern CP4, and the fifth conductive pattern CP5 are illustrated as being thinly and conformally formed so as not to completely fill the second hole HL2, the third hole HL3, the fourth hole HL4, and the fifth hole HL5, however, the inventive concepts are not limited thereto. For example, in some exemplary embodiments, the third conductive pattern CP3, the fourth conductive pattern CP4, and the fifth conductive pattern CP5 may fill the second hole HL2, the third hole HL3, the fourth hole HL4, and the fifth hole HL5, as shown in FIG. 1C.

Figure 10:
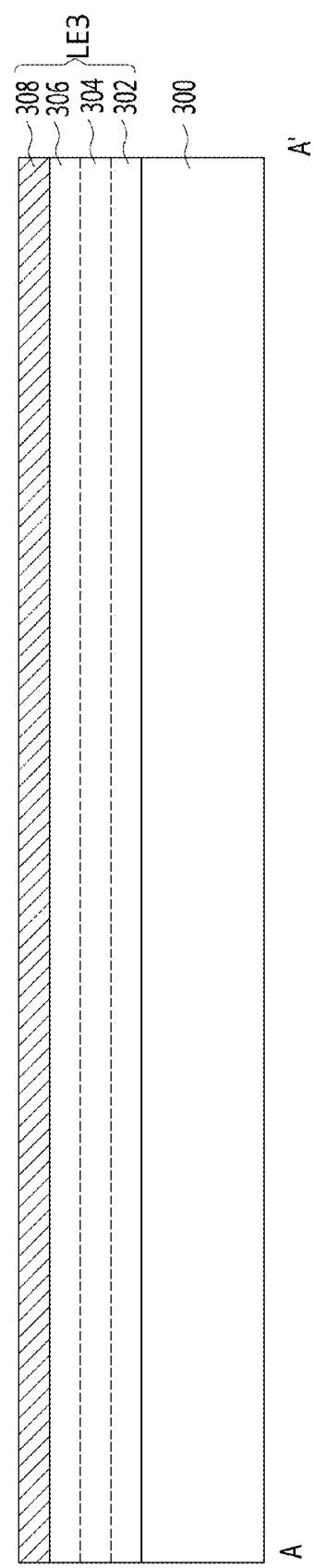

Referring to FIG. 10, a third n-type semiconductor layer 302, a third active layer 304, a third p-type semiconductor layer 306, and a third ohmic layer 308 may be sequentially formed on a third substrate 300 to form a third light emitting part LE3.

The third substrate 300 may be capable of growing a gallium nitride-based semiconductor layer thereon, and may include a sapphire ($Al_2O_3$), a silicon carbide (SiC), a gallium nitride (GaN), an indium gallium nitride (InGaN), an aluminum gallium nitride (AlGaN), an aluminum nitride (AlN), a gallium oxide ($Ga_2O_3$), a gallium arsenic (GaAs), or silicon (Si). Also, the third substrate 300 may be a flexible substrate, and/or may include a circuit therein.

The third n-type semiconductor layer 302, the third active layer 304, and the third p-type semiconductor layer 306 may be sequentially formed on the third substrate 300 by using a growing method, such as MOCVD, MBE, HVPE, and MOC.

The third ohmic layer 308 may be formed on the third p-type semiconductor layer 306 through CVD or PVD.

Figure 11:
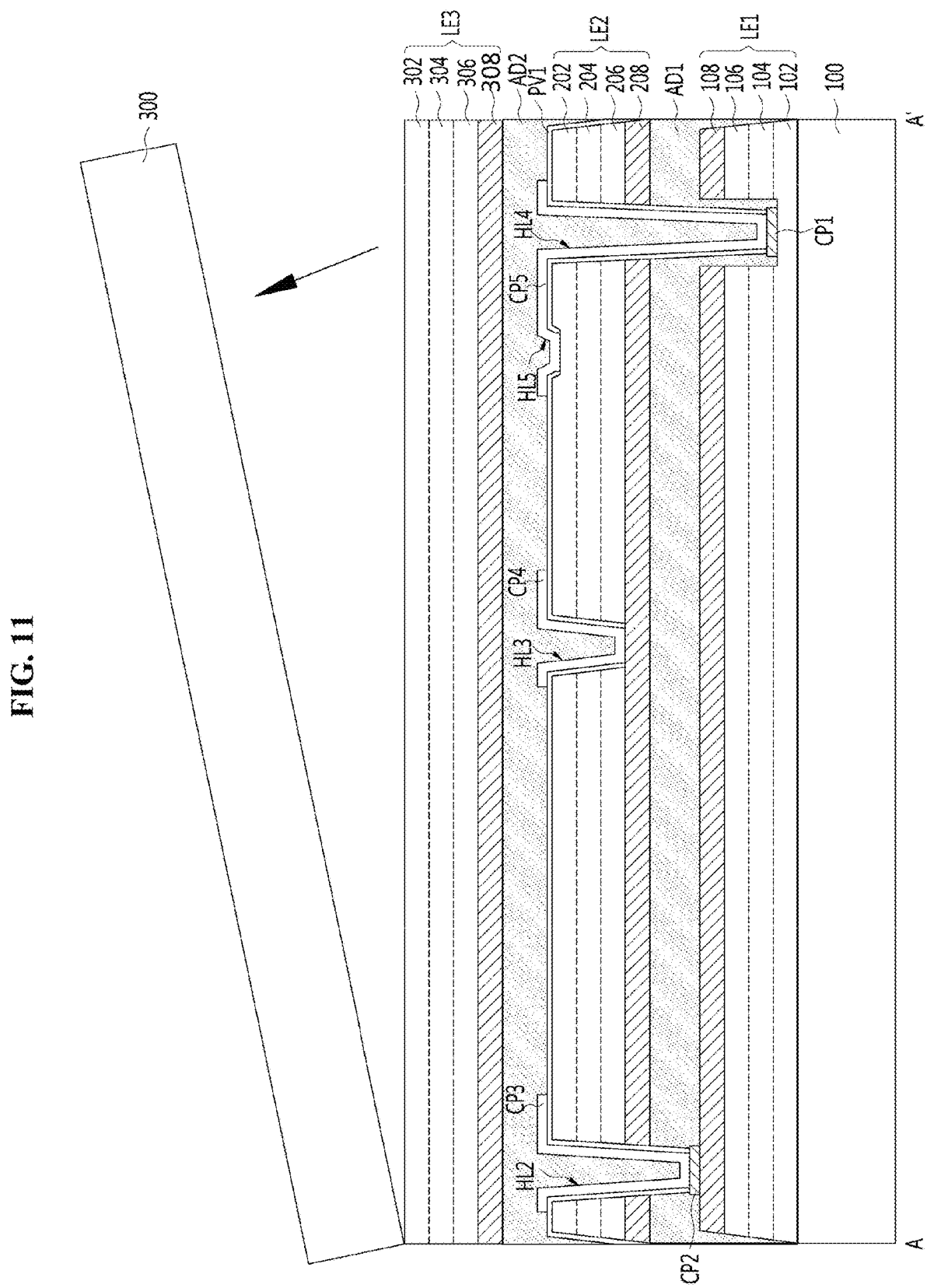

Referring to FIG. 11, by turning over the third substrate 300, the second n-type semiconductor layer 202 of the second light emitting part LE2 and the third ohmic layer 308 of the third light emitting part LE3 may be disposed to face each other, and the second light emitting part LE2 and the third light emitting part LE3 may be bonded to each other through a second adhesion part AD2.

For example, after the second adhesion part AD2 is formed on the second light emitting part LE2 to fill the second hole HL2, the third hole HL3, the fourth hole HL4, and the fifth hole HL5 formed with the third conductive pattern CP3, the fourth conductive pattern CP4, and the fifth conductive pattern CP5, and the third ohmic layer 308 is disposed to face the second n-type semiconductor layer 202, the second adhesion part AD2 may be cured through a thermal process or the like to bond the second light emitting part LE2 and the third light emitting part LE3 with each other.

In this case, the second adhesion part AD2 may surround the side of the second light emitting part LE2 and function as a protective layer to protect the side of the second light emitting part LE2.

After the second light emitting part LE2 and the third light emitting part LE3 are bonded with each other by the second adhesion part AD2, the third substrate 300 may be removed through an LLO process.

Figure 12:
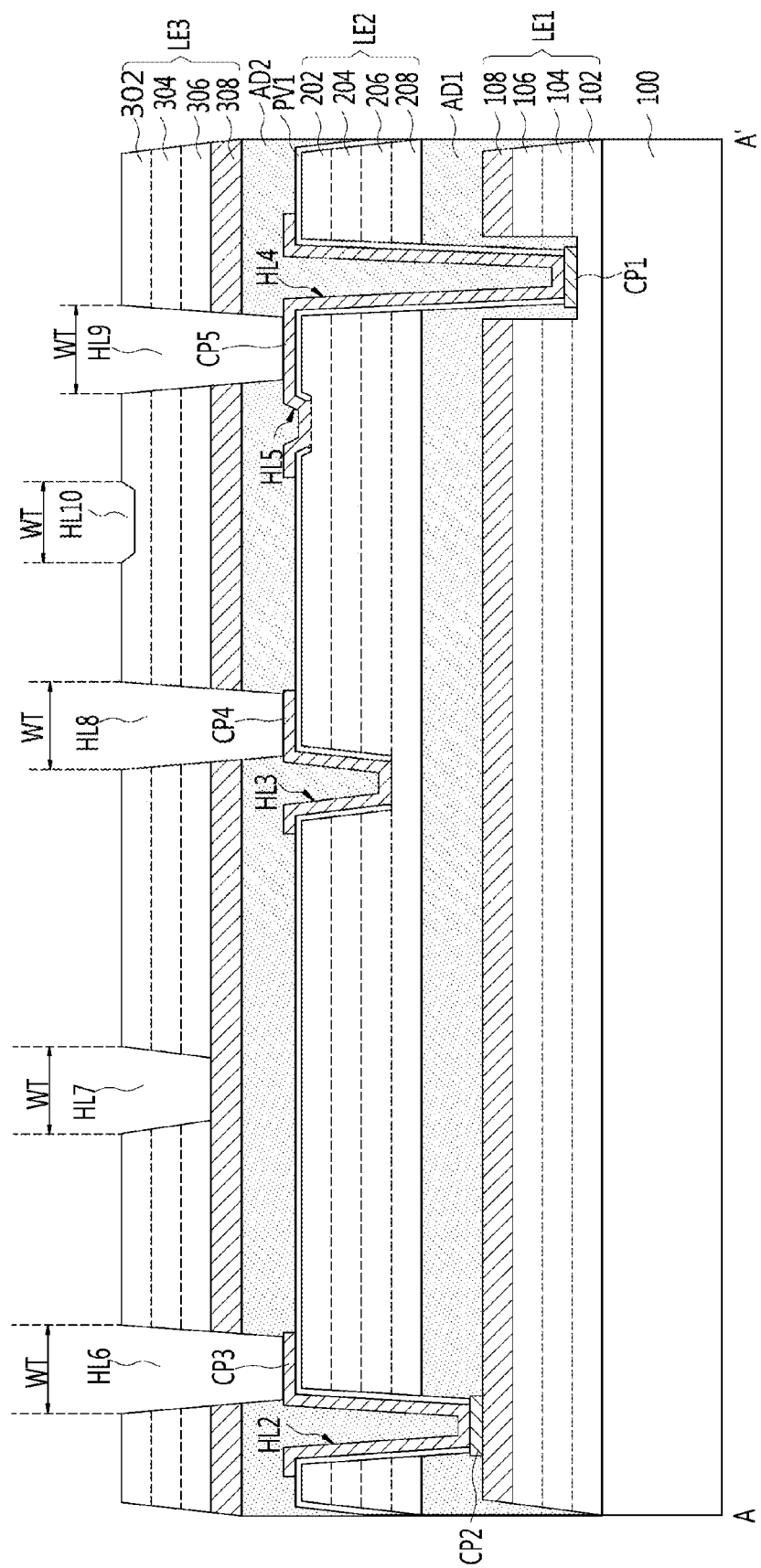

Referring to FIG. 12, by etching the third light emitting part LE3 and the second adhesion part AD2, a sixth hole HL6 exposing the second portion of the third conductive pattern CP3, a seventh hole HL7 exposing the third ohmic layer 308, an eighth hole HL8 exposing the second portion CP4_2 of the fourth conductive pattern CP4, a ninth hole HL9 exposing the second portion CP5_2 of the fifth conductive pattern CP5, and a tenth hole HL10 exposing a portion of the third n-type semiconductor layer 302 may be formed. In some exemplary embodiments, the tenth hole HL10 may not be formed.

Each of the sixth hole HL6, the seventh hole HL7, the eighth hole HL8, the ninth hole HL9, and the tenth hole HL10 may have substantially the same width WT. Each of the sixth hole HL6, the seventh hole HL7, the eighth hole HL8, the ninth hole HL9, and the tenth hole HL10 may have substantially the same width WT as each of the second hole HL2, the third hole HL3, the fourth hole HL4, and the fifth hole HL5. Each of the sixth hole HL6, the seventh hole HL7, the eighth hole HL8, the ninth hole HL9, and the tenth hole HL10 may have an inclined side surface, in which a width thereof gradually decreases in the downward direction.

While forming the sixth hole HL6, the seventh hole HL7, the eighth hole HL8, the ninth hole HL9, and the tenth hole HL10, by etching the third n-type semiconductor layer 302, the third active layer 304, the third p-type semiconductor layer 306, and the third ohmic layer 308, the third light emitting part LE3 may be isolated to suppress a tensile stress from being applied to the first substrate 100.

Figure 13:
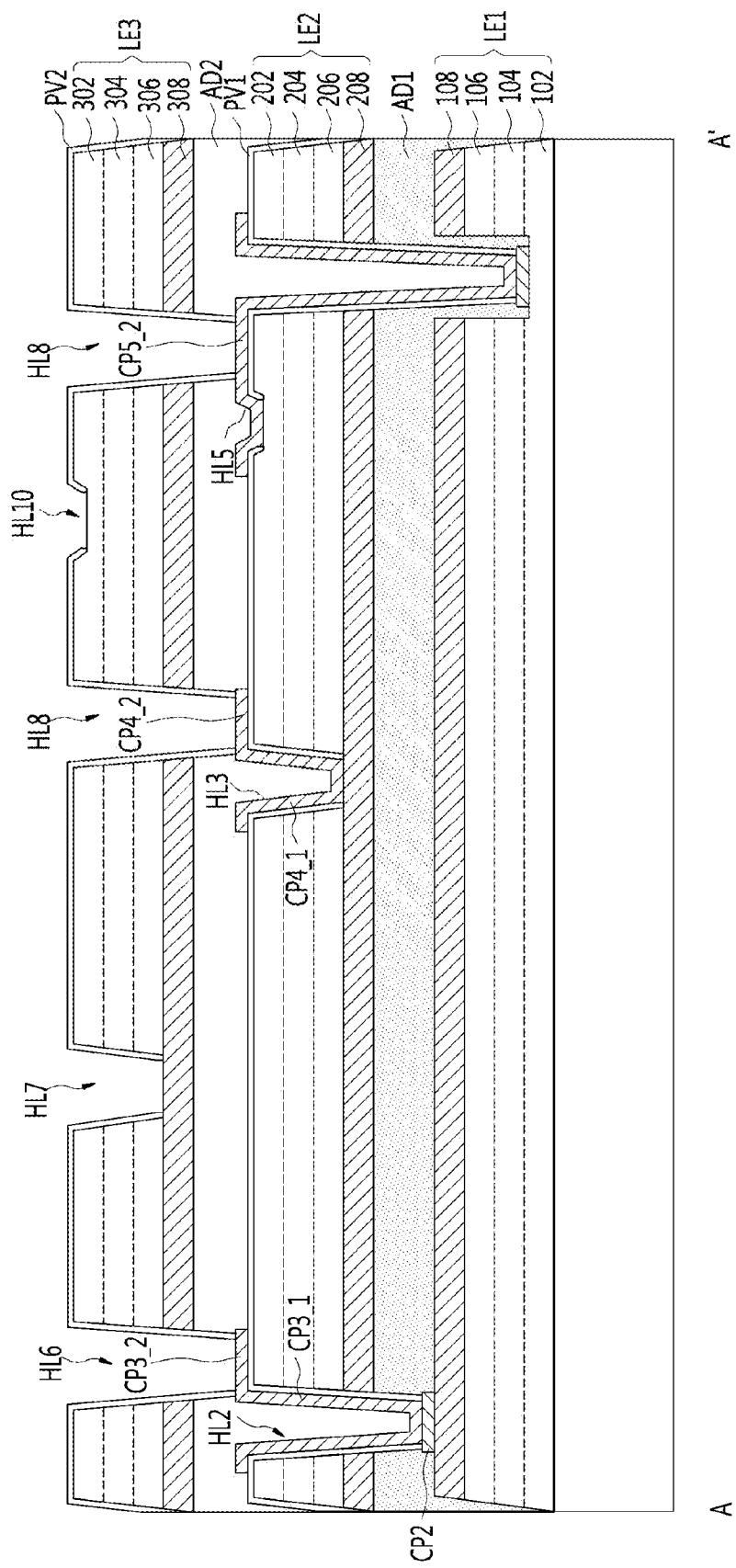

Referring to FIG. 13, a second passivation layer PV2 may be formed on the inner sidewalls of the sixth hole HL6, the seventh hole HL7, the eighth hole HL8, the ninth hole HL9, and the tenth hole HL10, and on the top surface of the third n-type semiconductor layer 302.

For example, the second passivation layer PV2 may be conformally formed on the third light emitting part LE3 and the second adhesion part AD2 formed with the sixth hole HL6, the seventh hole HL7, the eighth hole HL8, the ninth hole HL9, and the tenth hole HL10, while not completely filling the sixth hole HL6, the seventh hole HL7, the eighth hole HL8, the ninth hole HL9, and the tenth hole HL10. An inclined side surface of each of the sixth hole HL6, the seventh hole HL7, the eighth hole HL8, the ninth hole HL9, and the tenth hole HL10 may facilitate conformal deposition of the second passivation layer PV2. Then, the second passivation layer PV2 formed on the bottoms of the sixth hole HL6, the seventh hole HL7, the eighth hole HL8, the ninth hole HL9, and the tenth hole HL10 may be removed.

The second passivation layer PV2 may be retained on the outer sidewall of the third light emitting part LE3. In some exemplary embodiments, however, the second passivation layer PV2 may be removed from the outer sidewall of the third light emitting part LE3.

Figure 14:
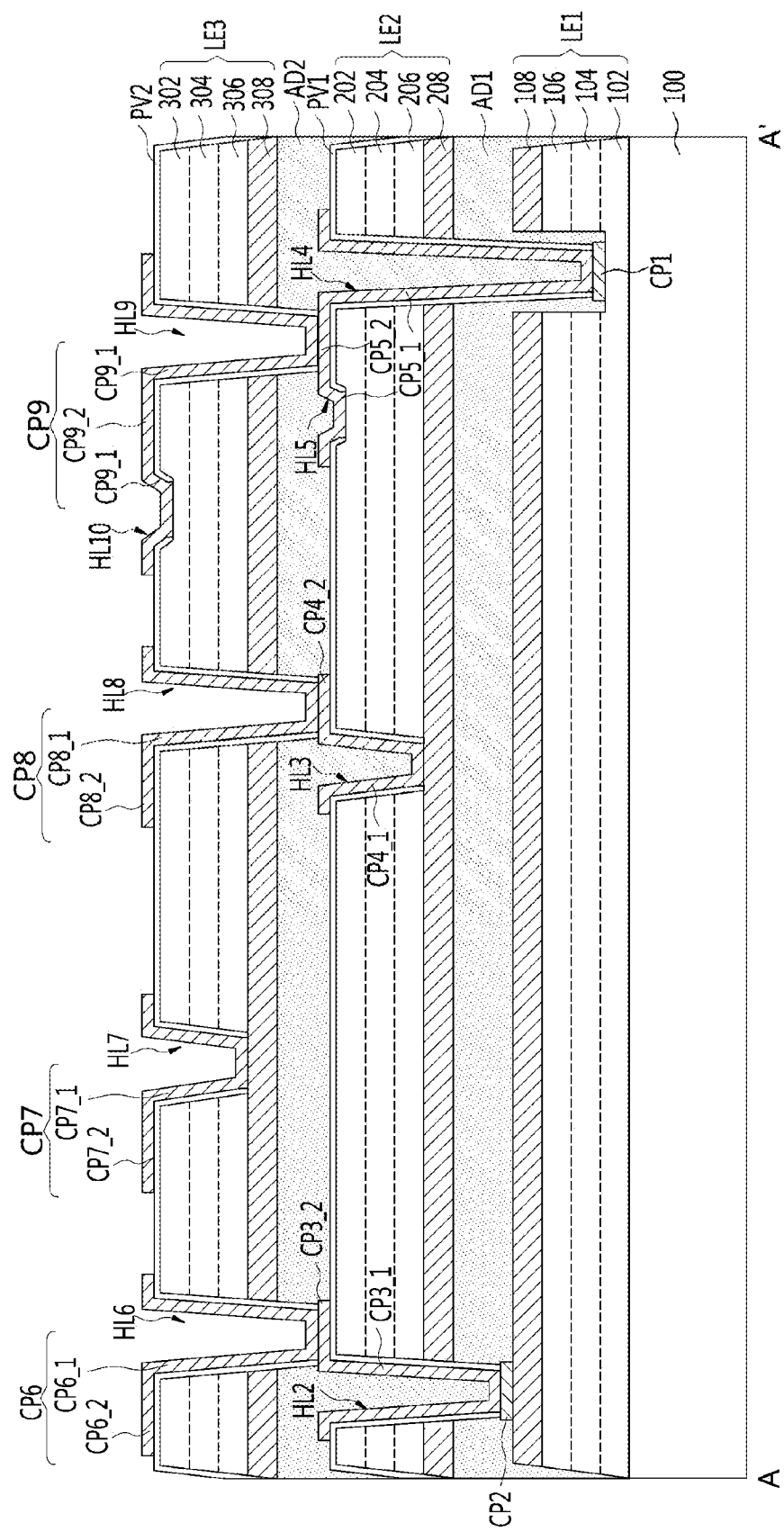

Referring to FIG. 14, a sixth conductive pattern CP6, a seventh conductive pattern CP7, an eighth conductive pattern CP8, and a ninth conductive pattern CP9, which at least partially fill the sixth hole HL6, the seventh hole HL7, the eighth hole HL8, the ninth hole HL9, and the tenth hole HL10 formed with the second passivation layer PV2 may be respectively formed.

For example, a second conductive layer may be conformally formed on the second passivation layer PV2 while not completely filling the sixth hole HL6, the seventh hole HL7, the eighth hole HL8, the ninth hole HL9, and the tenth hole HL10 formed with the second passivation layer PV2. As described above, as each of the sixth hole HL6, the seventh hole HL7, the eighth hole HL8, the ninth hole HL9 and the tenth hole HL10 has an inclined side surface, the second conductive layer may be easily formed conformally. Then, the second conductive layer may be etched to form the sixth conductive pattern CP6, which is electrically coupled with the second portion CP2_2 of the third conductive pattern CP3 and at least partially fills the sixth hole HL6, the seventh conductive pattern CP7, which is electrically coupled with the third ohmic layer 308 and at least partially fills the seventh hole HL7, the eighth conductive pattern CP8, which is electrically coupled with the second portion CP4_2 of the fourth conductive pattern CP4 and at least partially fills the eighth hole HL8, and the ninth conductive pattern CP9, which is electrically coupled with the second portion CP5_2 of the fifth conductive pattern CP5 and at least partially fills the ninth hole HL9 and the tenth hole HL10, respectively.

The sixth conductive pattern CP6 may include a first portion CP6_1, which is formed in the sixth hole HL6, and a second portion CP6_2, which extends from the first portion CP6_1 onto the second passivation layer PV2 formed on the third n-type semiconductor layer 302. The seventh conductive pattern CP7 may include a first portion CP7_1, which is formed in the seventh hole HL7, and a second portion CP7_2, which extends from the first portion CP7_1 onto the second passivation layer PV2 formed on the third n-type semiconductor layer 302. The eighth conductive pattern CP8 may include a first portion CP8_1, which is formed in the eighth hole HL8, and a second portion CP8_2, which extends from the first portion CP8_1 onto the second passivation layer PV2 formed on the third n-type semiconductor layer 302. The ninth conductive pattern CP9 may include first portions CP9_1, which are respectively formed in the ninth hole HL9 and the tenth hole HL10, and a second portion CP9_2, which couples the first portions CP9_1 and extends onto the second passivation layer PV2 formed on the third n-type semiconductor layer 302.

While the sixth conductive pattern CP6, the seventh conductive pattern CP7, the eighth conductive pattern CP8, and the ninth conductive pattern CP9 are illustrated as being conformally formed thin while not completely filling the sixth hole HL6, the seventh hole HL7, the eighth hole HL8, the ninth hole HL9, and the tenth hole HL10, however, the inventive concepts are not limited thereto. For example, in some exemplary embodiments, the sixth conductive pattern CP6, the seventh conductive pattern CP7, the eighth conductive pattern CP8, and the ninth conductive pattern CP9 may be formed to fill the sixth hole HL6, the seventh hole HL7, the eighth hole HL8, the ninth hole HL9, and the tenth hole HL10, as shown in FIG. 1C.

Figure 15:
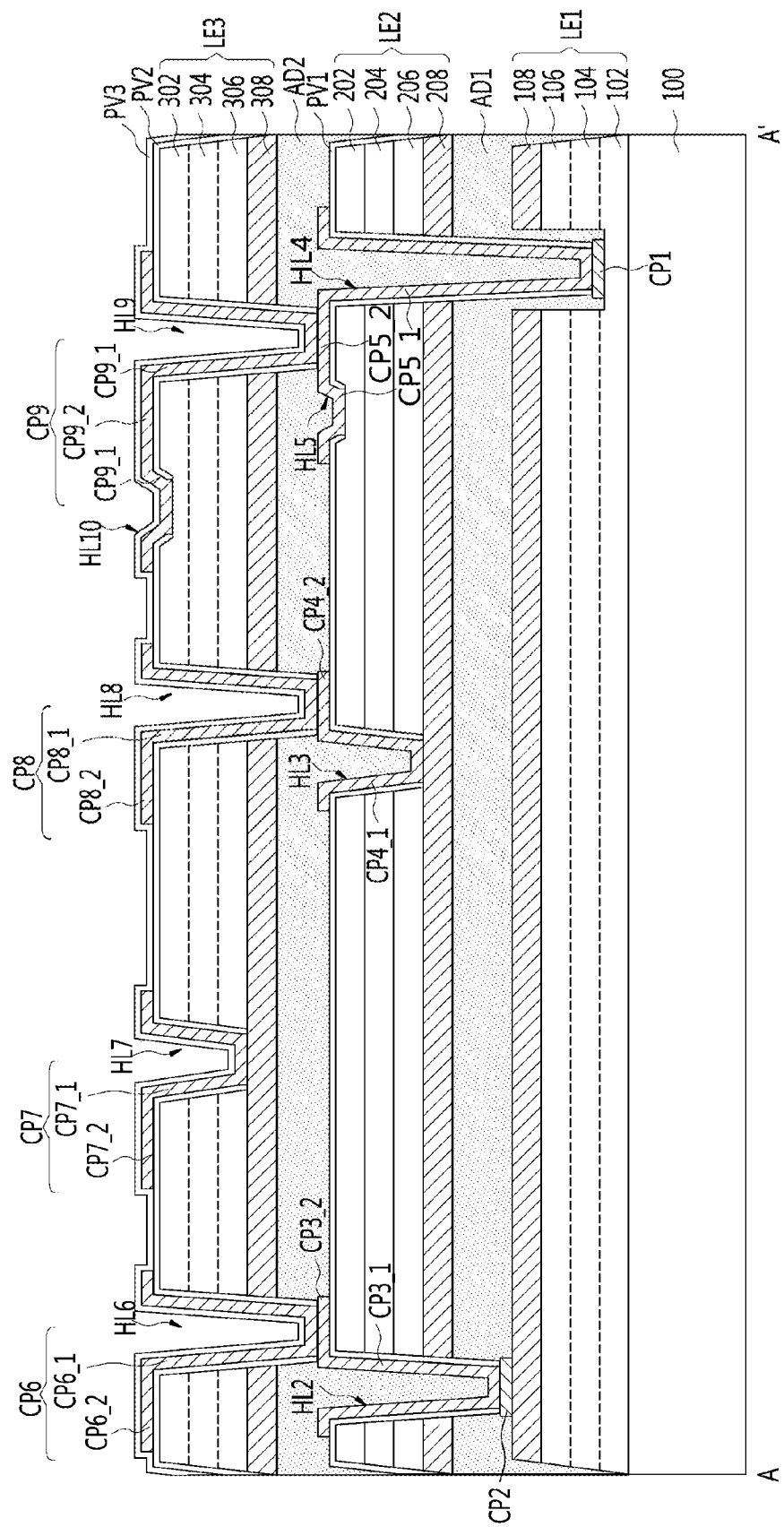

Referring to FIG. 15, a third passivation layer PV3 may be conformally formed on the sixth conductive pattern CP6, the seventh conductive pattern CP7, the eighth conductive pattern CP8, and the ninth conductive pattern CP9, and on the second passivation layer PV2. The third passivation layer PV3 may be conformally formed thin so as not to completely fill the sixth hole HL6, the seventh hole HL7, the eighth hole HL8, the ninth hole HL9, and the tenth hole HL10 formed with the sixth conductive pattern CP6, the seventh conductive pattern CP7, the eighth conductive pattern CP8, and the ninth conductive pattern CP9.

The third passivation layer PV3 may be formed on the second passivation layer PV2, which is formed on the outer sidewall of the third light emitting part LE3.

Figure 16:
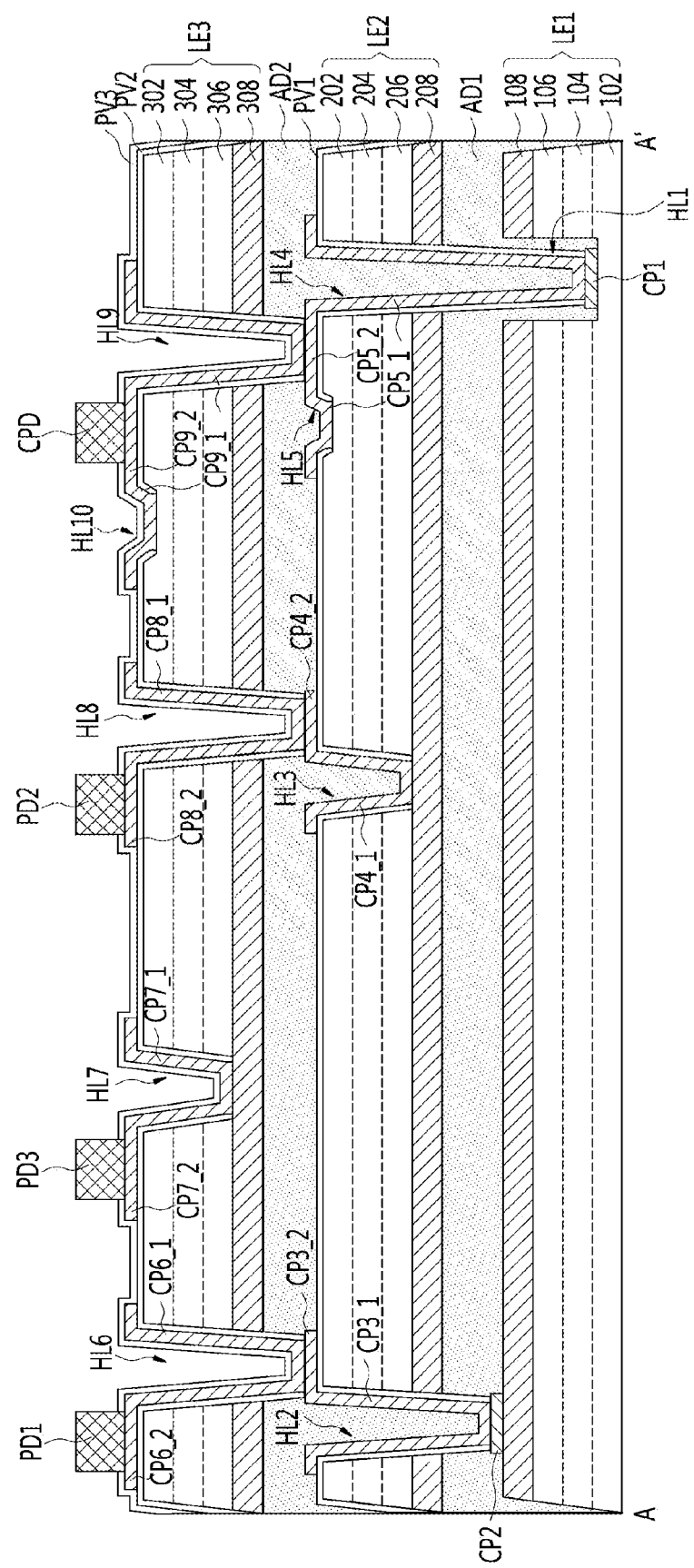

Referring to FIG. 16, a first pad PD1 electrically coupled with the sixth conductive pattern CP6, a second pad PD2 electrically coupled with the eighth conductive pattern CP8, a third pad PD3 electrically coupled with the seventh conductive pattern CP7, and a common pad CPD electrically coupled with the ninth conductive pattern CP9 may be respectively formed.

For example, by etching portions the third passivation layer PV3, openings that respectively expose the second portion CP6_2 of the sixth conductive pattern CP6, the second portion CP8_2 of the eighth conductive pattern CP8, the second portion CP7_2 of the seventh conductive pattern CP7, and the second portion CP9_2 of the ninth conductive pattern CP9 may be formed.

A third conductive layer may be formed on the third passivation layer PV3 to fill the openings formed on the third passivation layer PV3. Then, the first pad PD1 electrically coupled with the first ohmic layer 108 by being brought into electrical contact with the sixth conductive pattern CP6, the second pad PD2 electrically coupled with the second ohmic layer 208 by being brought into electrical contact with the eighth conductive pattern CP8, the third pad PD3 electrically coupled with the third ohmic layer 308 by being brought into electrical contact with the seventh conductive pattern CP7, and the common pad CPD electrically coupled in common with the third n-type semiconductor layer 302, the second n-type semiconductor layer, 202, and the first n-type semiconductor layer 102 by being brought into electrical contact with the ninth conductive pattern CP9 may be formed in the openings of the third passivation layer PV3.

In the second light emitting part LE2 and the first adhesion part AD1 according to the illustrated exemplary embodiment, the second hole HL2, which exposes the second conductive pattern CP2 electrically coupled with the first ohmic layer 108, the third hole HL3, which exposes the second ohmic layer 208, the fourth hole HL4, which exposes the first conductive pattern CP1 electrically coupled with the first n-type semiconductor layer 102, and the fifth hole HL5, which exposes the second n-type semiconductor layer 202 may be formed. In the third light emitting part LE3 and the second adhesion part AD2, the sixth hole HL6 exposing the third conductive pattern CP3, the seventh hole HL7 exposing the third ohmic layer 308, the eighth hole HL8 exposing the fourth conductive pattern CP4, the ninth hole HL9 exposing the fifth conductive pattern CP5, and the tenth hole HL10 exposing the third n-type semiconductor layer 302 may be formed during another process. In general, forming holes that pass through the first light emitting part LE1, the second light emitting part LE2, and the third light emitting part LE3 by etching may increase manufacturing complexity and difficulty because of aspect ratio. According to the illustrated exemplary embodiment, since one etching process is performed in the second light emitting part LE2 and the first adhesion part AD1, and another etching process is performed in the third light emitting part LE3 and the second adhesion part AD2, various holes in a light emitting device having a plurality of stacked light emitting parts may be easily formed.

Moreover, the third conductive pattern CP3, the fourth conductive pattern CP4, and the fifth conductive pattern CP5, which are electrically coupled with the first light emitting part LE1, may be disposed in the second light emitting part LE2 and the first adhesion part AD1, while the sixth conductive pattern CP6, the seventh conductive pattern CP7, the eighth conductive pattern CP8, and the ninth conductive pattern CP9, which are electrically coupled with the third conductive pattern CP3, the fourth conductive pattern CP4, and the fifth conductive pattern CP5 coupled with the first light emitting part LE1 may be separately disposed in the third light emitting part LE3 and the second adhesion part AD2. In this manner, the first pad PD1 may be electrically stably coupled with the first ohmic layer 108 through the third conductive pattern CP3 and the second conductive pattern CP2 along the sixth conductive pattern CP6. The second pad PD2 may be electrically stably coupled with the second ohmic layer 208 through the fourth conductive pattern CP4 along the eighth conductive pattern CP8. The third pad PD3 may be electrically stably coupled with the third ohmic layer 308 through the seventh conductive pattern CP7. Further, the common pad CPD may be electrically stably coupled with the third n-type semiconductor layer 302 through the ninth conductive pattern CP9, with the second n-type semiconductor layer 202 through the fifth conductive pattern CP5 along the ninth conductive pattern CP9, and with the first n-type semiconductor layer 102 through the first conductive pattern CP1 along the fifth conductive pattern CP5.

Hereafter, a method for mounting a light emitting device onto a mounting board will be described according to an exemplary embodiment.

Figure 17:
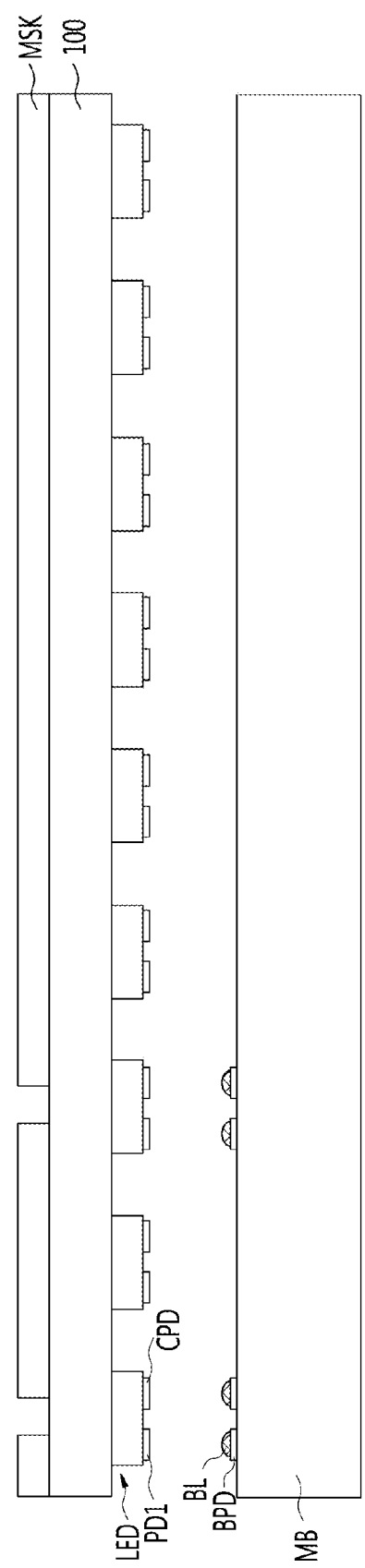
FIGS. 17 and 18 are cross-sectional views illustrating a method for mounting light emitting devices to a mounting board according to an exemplary embodiment.
Figure 18:
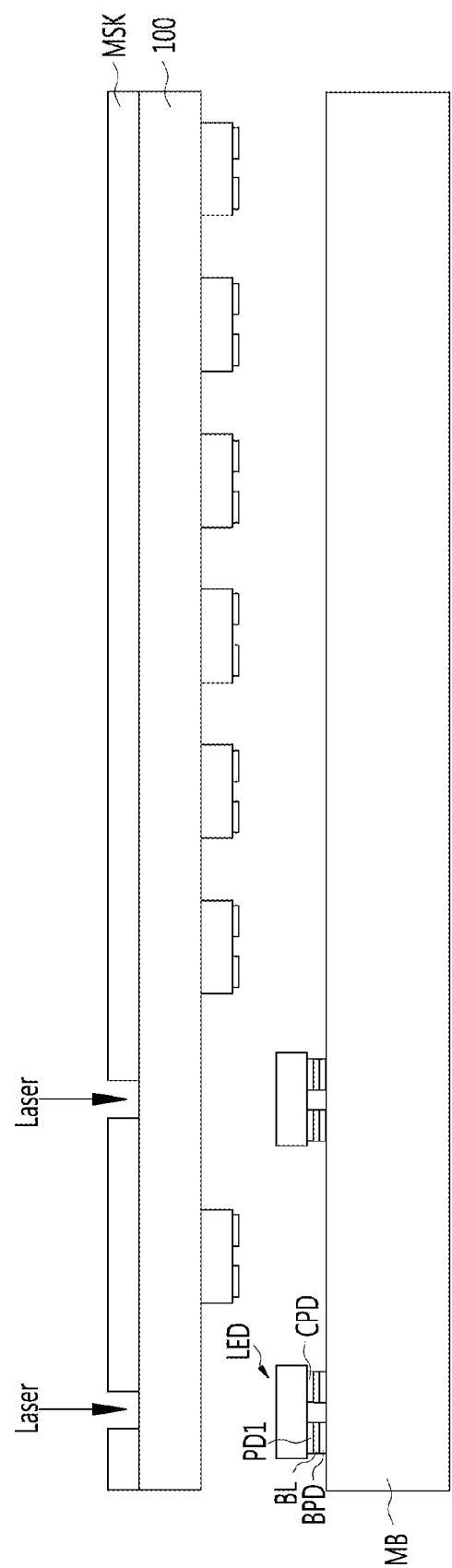

FIGS. 17 and 18 are cross-sectional views illustrating a method for mounting light emitting devices to a mounting board according to an exemplary embodiment.

Referring to FIG. 17, a plurality of light emitting devices LED, each of which may be formed through a process shown in FIGS. 2 to 16 may be mounted to a target mounting board MB.

Bonding pads BPD to be electrically bonded with the first pad PD1, the second pad PD2, the third pad PD3, and the common pad CPD, respectively, may be formed on the mounting board MB. Adhesion balls BL may be respectively formed on the bonding pads BPD. Each of the adhesion balls BL may include In, Au, Sn, Cu, and the like. Alternatively, the adhesion balls BL may be formed on the first pad PD1, the second pad PD2, the third pad PD3, and the common pad CPD.

The bonding pads BPD and the adhesion balls BL may be formed to correspond to positions where the light emitting devices LED are to be mounted.

By turning over the first substrate 100 is formed with the plurality of light emitting devices LED, the light emitting devices LED may face the mounting board MB formed with the bonding pads BPD.

A mask pattern MSK having a hole, which allows a laser to pass therethrough and is disposed at a position corresponding to the light emitting devices LED to be separated from the first substrate 100, may be provided on the first substrate 100. In some exemplary embodiments, however, the mask pattern MSK may be omitted.

Referring to FIG. 18, by performing a selective laser lift-off (LLO) process on the first substrate 100 through the mask pattern MSK, the light emitting devices LED facing target mounting positions of the mounting board MB may be selectively separated from the first substrate 100. A separation distance between the separated light emitting devices LED may be changed depending on the mounting board MB. When the light emitting devices LED are to be separated from the first substrate 100 by irradiating a laser onto the first substrate 100, the mask pattern MSK may be provided on the first substrate 100 to allow precise irradiation of the laser on the light emitting devices LEDs to be separated from the 100. However, if the laser can be properly irradiated to the light emitting devices LEDs to be separated, in some exemplary embodiments, the mask pattern MSK may be omitted.

The first pad PD1, the second pad PD2, the third pad PD3, and the common pad CPD of each of the separated light emitting devices LED may be respectively bonded with the adhesion balls BL, which are formed on the bonding pads BPD. In this manner, the light emitting devices LED may be mounted to the mounting board MB.

When all the light emitting devices LED are mounted at the target positions, the first substrate 100 may be separated from the light emitting devices LED without an additional process for removing the first substrate 100.

In the light emitting device according to exemplary embodiments, by forming via holes in each of a plurality of light emitting parts and forming conductive patterns, which at least partially fill the via holes and extend to portions of each light emitting part, it is possible to electrically couple conductive patterns with a first pad, a second pad, a third pad, and a common pad more stably as compared when the via holes are formed after each light emitting part is stacked.

Further, since each of the plurality of light emitting parts is isolated while forming via holes, a tensile stress to be applied to a substrate may be mitigated.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device comprising:
a first light emitting part, a second light emitting part, and a third light emitting part disposed one over another along a first direction, each of the first, second, and third light emitting parts including a first-type semiconductor layer, an active layer, and a second-type semiconductor layer;
a first conductive pattern at least partially disposed between the second and third light emitting parts, the first conductive pattern including a first portion extending in a second direction perpendicular to the first direction and electrically coupled with at least one of the first-type and second-type semiconductor layers of the second light emitting part, and a second portion extending from one end of the first portion and disposed on one surface of the second light emitting part between the second and third light emitting parts;
a second conductive pattern disposed on the third light emitting part and electrically coupled with the third light emitting part; and
a first passivation covering the first light emitting part, wherein:
the first passivation includes a first portion extending in the second direction, and a second portion extending from one end of the first portion and forming an inclined angle with the second direction, and
the first conductive pattern at least partially overlaps with the second portion of the first passivation.

2. The light emitting device according to claim 1, wherein:
the second light emitting part includes a via hole passing through at least a portion of the second light emitting part and at least partially filled with an insulating material; and
the first portion of the first conductive pattern is formed along the via hole.

3. The light emitting device according to claim 2, wherein:
the third light emitting part includes a via hole passing through the third light emitting part;
the second conductive pattern includes a first portion formed along the via hole of the third light emitting part, and a second portion extending from the first portion of the second conductive pattern onto one surface of the third light emitting part; and
the second portion of the first conductive pattern and the first portion of the second conductive pattern partially overlap with each other.

4. The light emitting device according to claim 1, wherein at least a portion of the first passivation directly contacts the first conductive pattern.

5. The light emitting device according to claim 1, wherein the second conductive pattern at least partially overlaps with the second portion of the first passivation.

6. The light emitting device according to claim 5, wherein the second conductive pattern further at least partially overlaps with the first portion of the first passivation.

7. The light emitting device according to claim 1, further comprising a pad electrically coupled with the second conductive pattern.

8. The light emitting device according to claim 1, wherein the first passivation includes a plurality of openings, and at least one of the openings does not overlap the first conductive pattern.

9. The light emitting device according to claim 1, wherein the second conductive pattern at least partially overlaps with the second portion of the first conductive pattern.

10. The light emitting device according to claim 1, further comprising a second passivation disposed between the first and third light emitting parts, and a third passivation disposed on the first passivation,
wherein each of the first, second, and third passivations comprise a film.

11. A light emitting device comprising:
a first light emitting part, a second light emitting part, and a third light emitting part disposed one over another along a first direction, each of the first, second, and third light emitting parts including a first-type semiconductor layer, an active layer, and a second-type semiconductor layer;
a first conductive pattern at least partially disposed between the second and third light emitting parts;
a second conductive pattern disposed on the third light emitting part and electrically coupled with the third light emitting part, the second conductive pattern including a first portion extending in a second direction perpendicular to the first direction and electrically coupled with at least one of the first-type and second-type semiconductor layers of the third light emitting part, and a second portion extending from one end of the first portion and forming an inclined angle with the second direction; and
a first passivation covering the first light emitting part, wherein:
the first passivation includes a first portion extending in the second direction, and a second portion extending from one end of the first portion and forming an inclined angle with the second direction, and
the second conductive pattern at least partially overlaps with the second portion of the first passivation.

12. The light emitting device according to claim 11, wherein at least a portion of the first passivation directly contacts the first conductive pattern.

13. The light emitting device according to claim 11, wherein the second conductive pattern at least partially overlaps with the first portion of the first passivation.

14. The light emitting device according to claim 11, wherein the second conductive pattern at least partially overlaps with the first conductive pattern.

15. The light emitting device according to claim 11, wherein the first passivation includes a plurality of openings, and at least one of the openings does not overlap the first conductive pattern.

16. A light emitting device comprising:
a first light emitting part, a second light emitting part, and a third light emitting part disposed one over another along a first direction, each of the first, second, and third light emitting parts including a first-type semiconductor layer, an active layer, and a second-type semiconductor layer;
a first conductive pattern at least partially disposed between the second and third light emitting parts;
a second conductive pattern disposed on the third light emitting part and electrically coupled with the third light emitting part; and
a first passivation covering the first light emitting part, wherein:
the first passivation includes a first portion extending in a second direction perpendicular to the first direction, and a second portion extending from one end of the first portion and forming an inclined angle with the second direction, and
each of the first conductive pattern and the second conductive pattern at least partially overlaps with the second portion of the first passivation.

17. The light emitting device according to claim 16, wherein at least a portion of the first passivation directly contacts the first conductive pattern.

18. The light emitting device according to claim 16, wherein the second conductive pattern at least partially overlaps with the first portion of the first passivation.

19. The light emitting device according to claim 16, wherein the first passivation includes a plurality of openings, and at least one of the openings does not overlap the first conductive pattern.

20. The light emitting device according to claim 16, wherein:
each of the first and second conductive patterns includes a first portion extending in the second direction and electrically coupled with at least one of the first-type and second-type semiconductor layers of the respective ones of the second and third light emitting parts, and a second portion extending from one end of the first portion and forming an inclined angle with the second direction; and
the second portions of the first and second conductive patterns do not overlap each other.

* * * * *